US012622102B2

(12) United States Patent
Lee et al.

(10) Patent No.: US 12,622,102 B2
(45) Date of Patent: May 5, 2026

(54) DISPLAY DEVICE

(71) Applicant: LG Display Co., Ltd., Seoul (KR)

(72) Inventors: Choong Hoon Lee, Paju-si (KR); Yoon Dong Cho, Paju-si (KR); Chang Yoon Yang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 440 days.

(21) Appl. No.: 18/459,058

(22) Filed: Aug. 31, 2023

(65) Prior Publication Data

US 2024/0258461 A1     Aug. 1, 2024

(30) Foreign Application Priority Data

Jan. 30, 2023     (KR) ........................ 10-2023-0011942

(51) Int. Cl.
| | |
|---|---|
| H10H 20/825 | (2025.01) |
| H01L 25/075 | (2006.01) |
| H01L 25/16 | (2023.01) |
| H10H 20/857 | (2025.01) |

(52) U.S. Cl.
CPC ....... H10H 20/825 (2025.01); H01L 25/0753 (2013.01); H01L 25/167 (2013.01); H10H 20/857 (2025.01)

(58) Field of Classification Search
CPC ........................... H10H 20/857; H01L 25/0753
USPC ................................................. 313/498–512
See application file for complete search history.

(56) References Cited

U.S. PATENT DOCUMENTS

| | | | | |
|---|---|---|---|---|
| 2015/0160490 A1* | 6/2015 | Yamazaki | .......... | H10K 59/1216 |
| | | | | 349/42 |
| 2024/0224624 A1* | 7/2024 | Lee | ...................... | H10K 50/813 |
| 2024/0258464 A1* | 8/2024 | Lee | .................... | H10H 20/8312 |

FOREIGN PATENT DOCUMENTS

| | | | | |
|---|---|---|---|---|
| CN | 110085716 B | * 12/2024 | .......... | H10H 20/852 |
| KR | 10-2016-0056396 A | 5/2016 | | |
| KR | 10-2018-0013617 A | 2/2018 | | |
| KR | 10-2019-0024464 A | 3/2019 | | |
| KR | 10-2021-0070132 A | 6/2021 | | |
| KR | 10-2021-0078023 A | 6/2021 | | |

* cited by examiner

*Primary Examiner* — Christopher M Raabe
(74) *Attorney, Agent, or Firm* — PnK IP LLC

(57) ABSTRACT

A display device includes a light-emitting device that may be disposed on an upper planarization layer of a pixel area. A bank insulating layer defining an emission area may be disposed on the upper planarization layer. The upper planarization may include a protruding portion overlapping with the emission area. An edge of the protruding portion may be a curved surface having a constant curvature. The light-emitting device may include a first electrode, a light-emitting layer and a second electrode, which are sequentially stacked on the emission area. The protruding portion may be covered by the first electrode. Thus, in the display device, a decrease in luminance according to a viewing angle may be reduced.

15 Claims, 14 Drawing Sheets

DISPLAY DEVICE

CROSS-REFERENCE TO RELATED APPLICATION

This application claims the priority of Korean Patent Application No. 10-2023-0011942, filed on Jan. 30, 2023, which is hereby incorporated by reference in its entirety.

BACKGROUND

Field of the Disclosure

The present disclosure relates to a display device in which a light-emitting device is disposed in each pixel area.

Description of the Background

Generally, a display device provides an image to user. For example, the display device may include a plurality of pixel area. Each of the pixel areas may realize a specific color. For example, a light-emitting device may be disposed in each pixel area. The light-emitting device may emit light displaying a specific color. For example, the light-emitting device may have a stacked structure of a first electrode, a light-emitting layer and a second electrode.

A pixel driving circuit electrically connected to the light-emitting device may be disposed in each pixel area. The pixel driving circuit of each pixel area may be disposed on a device substrate. The light-emitting device of each pixel area may be disposed on a planarization layer covering the pixel driving circuit of the corresponding pixel area. For example, the first electrode of each light-emitting device may be disposed parallel to an upper surface of the device substrate toward the pixel driving circuit of each pixel area. Thus, in the display device, the luminance of the image provided to a user positioned at an angle may rapidly decrease. Therefore, in the display device, a quality deviation of the image according to a viewing angle may occur.

SUMMARY

Accordingly, the present disclosure is directed to a display device that substantially obviates one or more problems due to limitations and disadvantages described above.

More specifically, the present disclosure is to provide a display device capable of minimizing the quality deviation of the image according to the viewing angle.

The present disclosure is also to provide a display device capable of reducing a decrease in the luminance of the image according to the viewing angle.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the purpose of the present disclosure, as embodied and broadly described herein, a display device includes a device substrate, an upper planarization layer is disposed on the device substrate. The upper planarization layer includes a protruding portion. The protruding portion of the upper planarization is disposed in a pixel area. A first electrode and a bank insulating layer are disposed on the upper planarization layer. The first electrode is disposed on the pixel area. The first electrode covers the protruding portion. The bank insulating layer includes an opening. The opening of the bank insulating layer exposed a portion of the first electrode. A light-emitting layer is disposed on the portion of the first electrode exposed by the opening of the bank insulating layer. A second electrode is disposed on the light-emitting layer. The second electrode extends on the bank insulating layer. An edge of the protruding portion is a curved surface having a constant curvature. The first electrode includes a curved region overlapping with the edge of the protruding portion.

The curved region of the first electrode may have a closed loop shape extending along an edge of the opening.

A lower planarization layer may be disposed between the device substrate and the upper planarization layer. An intermediate electrode may be disposed between the lower planarization layer and the upper planarization layer of the pixel area. The intermediate electrode may have a symmetrical shape with respect to a center of the opening.

The intermediate electrode may have a size larger than the opening of the bank insulating layer.

An upper surface of the protruding portion opposite to the device substrate may be a flat surface.

The opening of the bank insulating layer may have a size larger than the upper surface of the protruding portion.

The opening of the bank insulating layer may overlap at least a portion of the curved region of the first electrode. The curved region of the first electrode overlapping with the opening may have a constant width.

The curved region of the first electrode overlapping with the opening may have a closed loop shape extending along the edge of the opening.

In another aspect of the present disclosure, a display device includes a device substrate, and a bank insulating layer disposed on a pixel area of the device substrate. The bank insulating layer defines an emission area. An upper planarization layer is disposed between the device substrate and the bank insulating layer. The upper planarization layer includes a protruding portion overlapping with the emission area. A light-emitting device is disposed on the upper planarization layer of the emission area. The light-emitting device has a stacked structure of a first electrode, a light-emitting layer and a second electrode. The first electrode extends between the upper planarization layer and the bank insulating layer along a surface of the protruding portion opposite to the device substrate. An edge of the protruding portion has a convex shape.

The edge of the protruding portion having a convex shape may have a closed loop shape extending an outer edge of the emission area.

A lower planarization layer may be disposed between the device substrate and the upper planarization layer. A pixel driving circuit may be disposed between the pixel area of the device substrate and the lower planarization layer. An intermediate electrode and a first signal wiring may be disposed between the lower planarization layer and the upper planarization layer. The intermediate electrode may be electrically connected to the pixel driving circuit and the first electrode. A first signal wiring may be spaced apart from the intermediate electrode. The first signal wiring may be symmetric with the intermediate electrode with respect to a center of the emission area.

The first signal wiring may extend in a direction. The intermediate electrode may extend parallel to the first signal wiring in the pixel area.

The first signal wiring may include a same material as the intermediate electrode.

The first signal wiring may have a same width as the intermediate electrode.

A second signal wiring may be disposed between the lower planarization layer and the upper planarization layer. The second signal wiring may cross a center of the emission area. A distance between the intermediate electrode and the second signal wiring may be the same as a distance between the first signal wiring and the second signal wiring.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the present disclosure and are incorporated in and constitute a part of this application, illustrate various aspects of the present disclosure and together with the description serve to explain the principle of the present disclosure.

In the drawings:

FIG. 2 is a view showing a circuit of a unit pixel area in the display device according to the aspect of the present disclosure;

FIG. 3 is a top view of the unit pixel area in the display device according to the aspect of the present disclosure;

FIG. 5 is a view taken along II-II' of FIG. 3;

Figure 9:
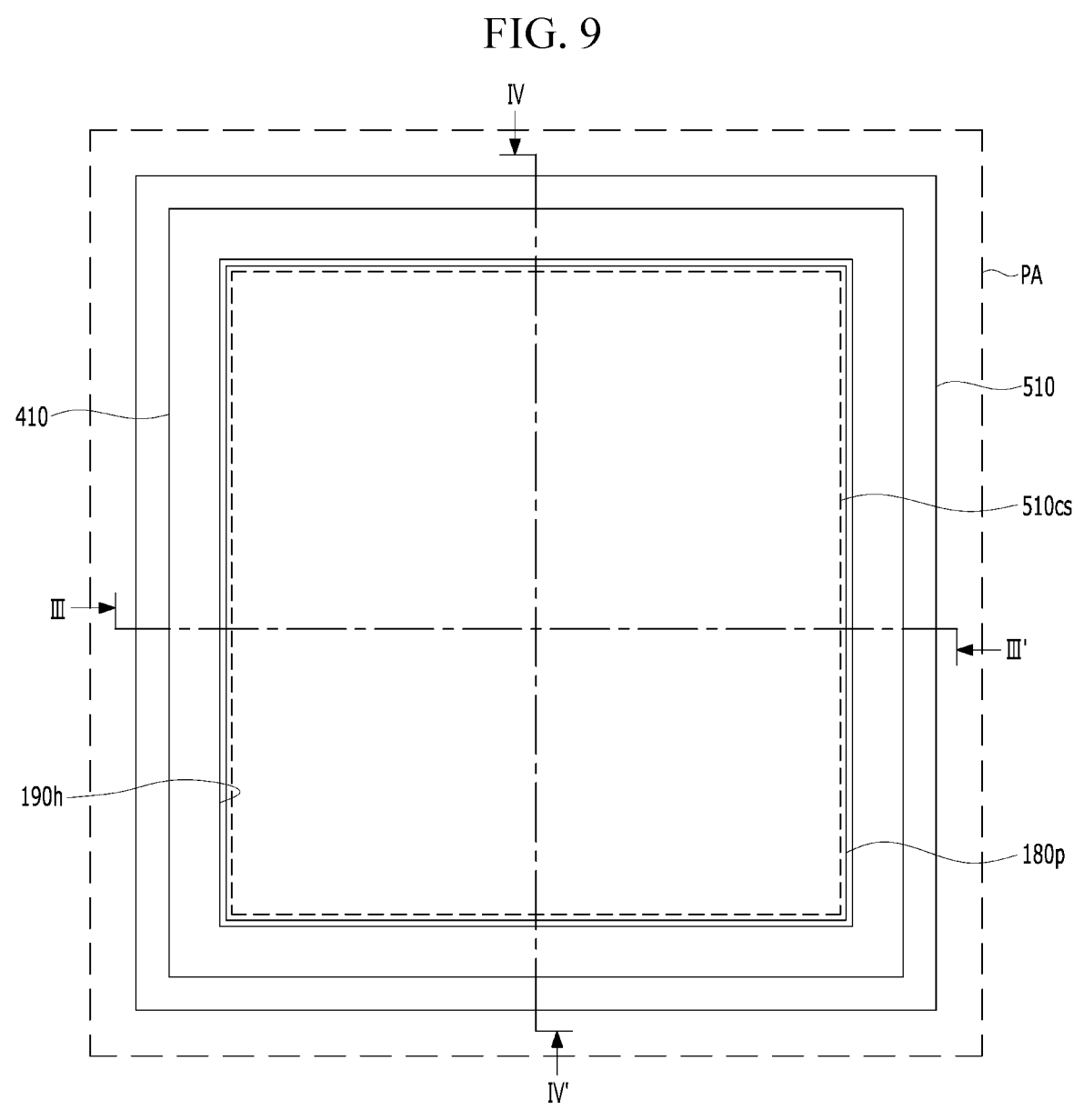
Figure 11:
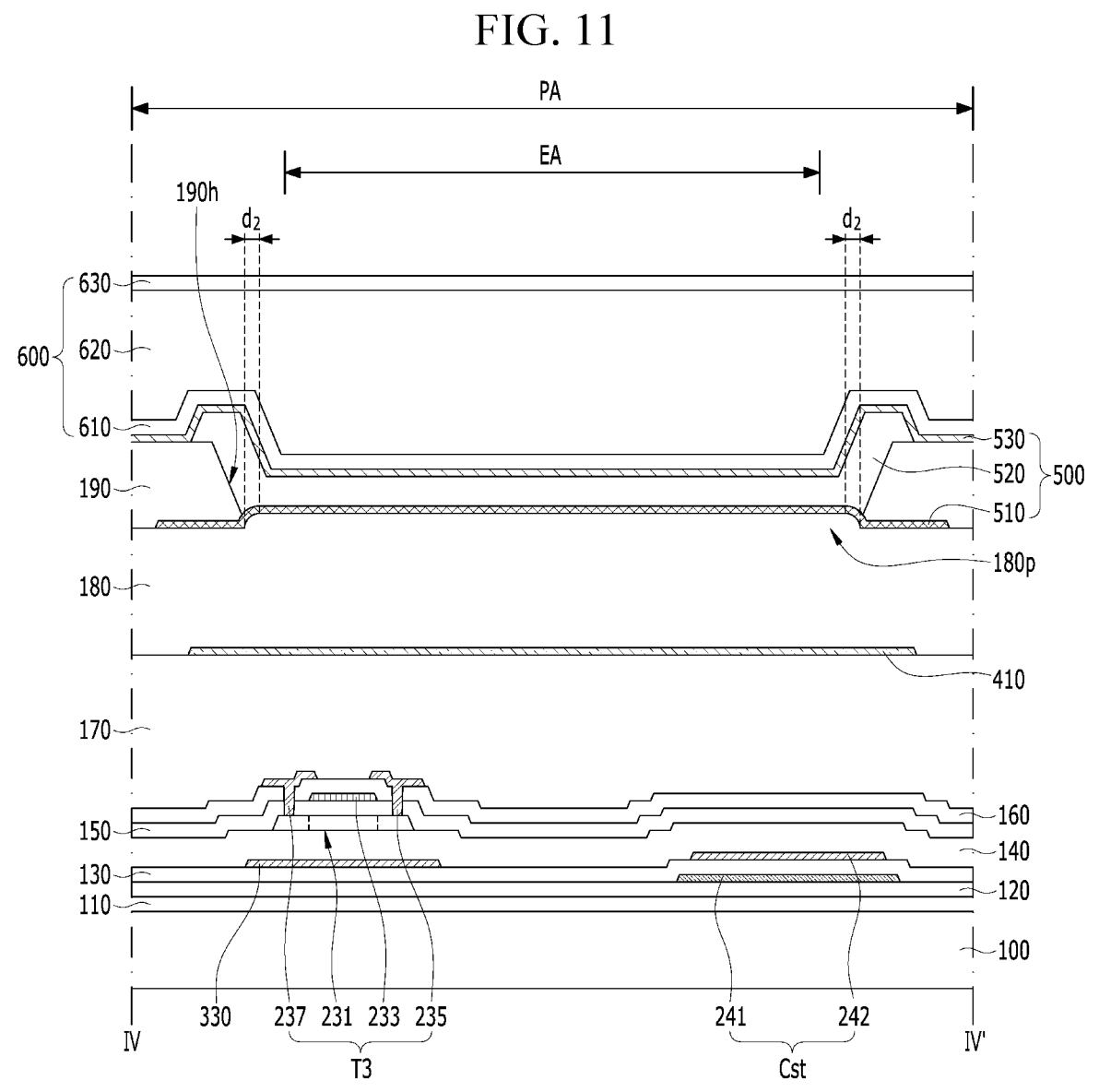
Figure 12:
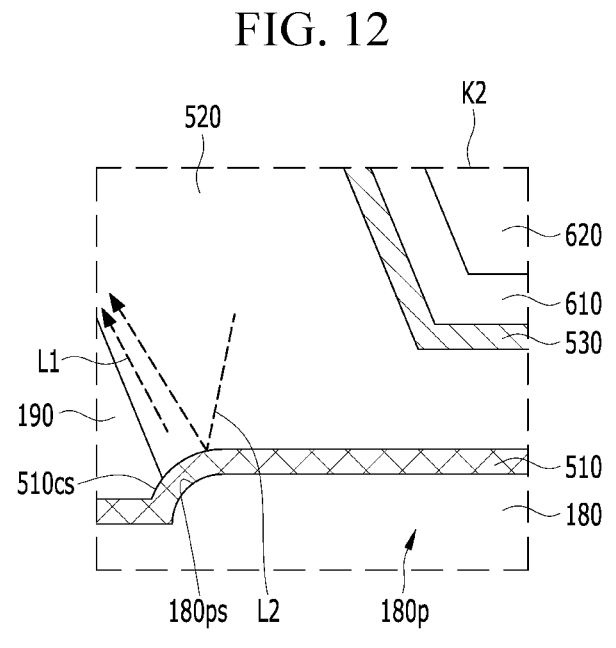
Figure 15:
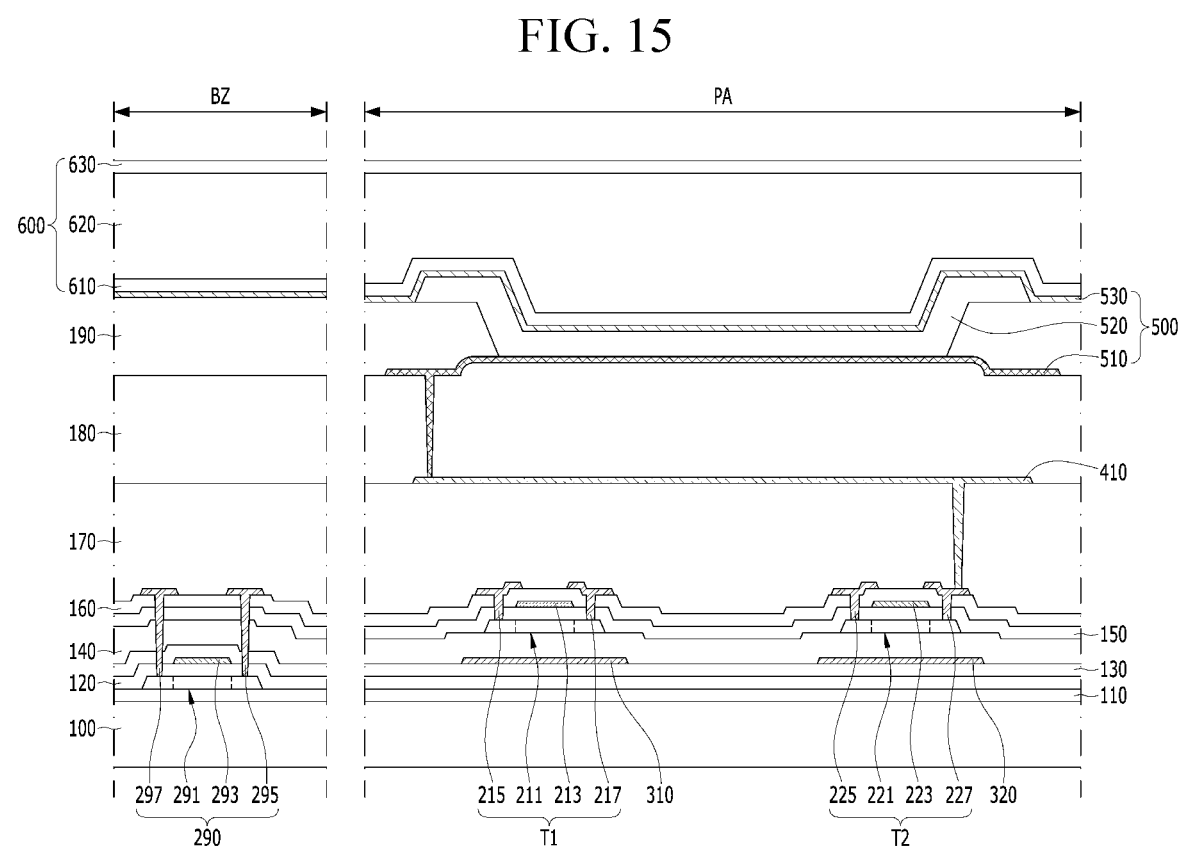

FIGS. 8 to 15 are views showing the display device according to another aspect of the present disclosure.

DETAILED DESCRIPTION

Figure 1:
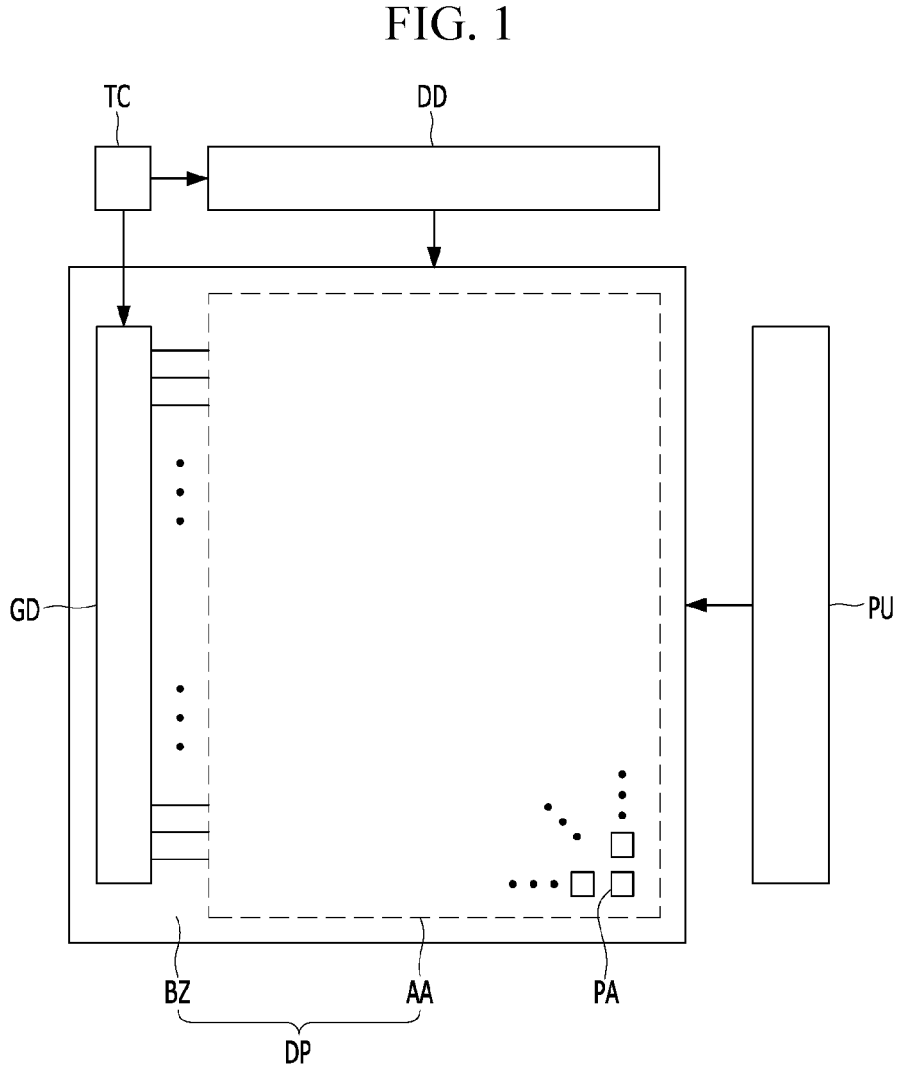
FIG. 1 is a view schematically showing a display device according to an aspect of the present disclosure.

Hereinafter, details related to the above features, technical configurations, and operational effects of the aspects of the present disclosure will be clearly understood by the following detailed description with reference to the drawings, which illustrate some aspects of the present disclosure. Here, the aspects of the present disclosure are provided to allow the technical sprit of the present disclosure to be satisfactorily transferred to those skilled in the art, and thus the present disclosure may be embodied in other forms and is not limited to the aspects described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used to describe particular aspects, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example aspects belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 2:
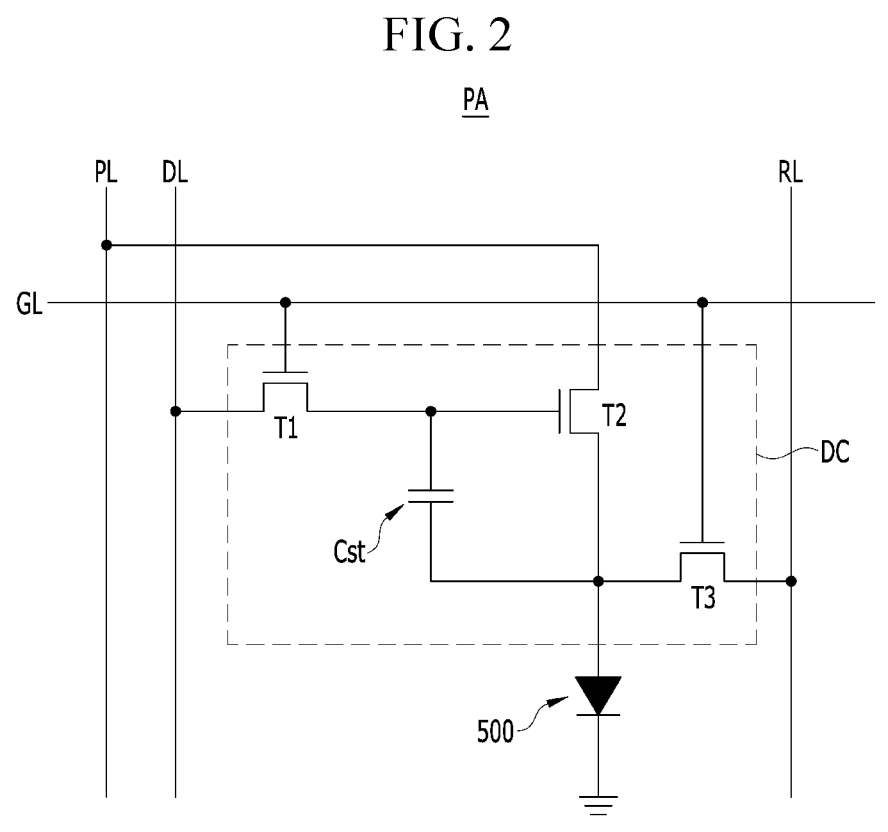

FIG. 1 is a view schematically showing a display device according to an aspect of the present disclosure. FIG. 2 is a view showing a circuit of a unit pixel area in the display device according to the aspect of the present disclosure.

Referring to FIGS. 1 and 2, the display device according to the aspect of the present disclosure may include a display panel DP. The display panel DP may generate an image provided to a user. For example, the display panel DP may include a plurality of pixel area PA.

Various signals may be provided in each pixel area PA through signal wirings GL, DL, PL and RL. For example, the signal wirings GL, DL, PL and RL may include gate lines GL applying a gate signal to each pixel area PA, data lines DL applying a data signal to each pixel area PA, power voltage supply lines PL supplying a power voltage to each pixel area PA, and reference voltage supply lines RL applying a reference voltage to each pixel area PA. The gate lines GL may be electrically connected to a gate driver GD. The data lines DL may be electrically connected to a data driver DD. The gate driver GD and the data driver DD may be controlled by a timing controller TC. For example, the gate driver GD may receive clock signals, reset signals and start signals from the timing controller TC, and the data driver DD may receive digital video data and a source timing signal from the timing controller TC. The power voltage supply lines PL and the reference voltage supply lines RL may be electrically connected to a power unit PU.

The display panel DP may include a display area AA in which the pixel areas PA are disposed, and a bezel area BZ disposed outside the display area AA. At least one of the gate driver GD, the data driver DD, the timing controller TC and the power unit PU may be disposed on the bezel area BZ of the display panel DP. For example, the display device according to the aspect of the present disclosure may be a GIP (Gate In Panel) type display device in which the gate driver GD is formed in the bezel area BZ of the display panel DP.

Each of the pixel areas PA may realize a specific color. For example, a pixel driving circuit DC electrically connected to a light-emitting device 500 may be disposed in each pixel area PA. The pixel driving circuit DC of each pixel area PA may be disposed on a device substrate 100. The device substrate 100 may include an insulating material. For example, the device substrate 100 may include glass or plastic.

The pixel driving circuit DC of each pixel area PA may supply a driving current corresponding to the data signal to the light-emitting device 500 of the corresponding pixel area PA according to gate signal for one frame. For example, the pixel driving circuit DC of each pixel area PA may include a first thin film transistor T1, a second thin film transistor T2, a third thin film transistor T3 and a storage capacitor Cst.

Figure 3:
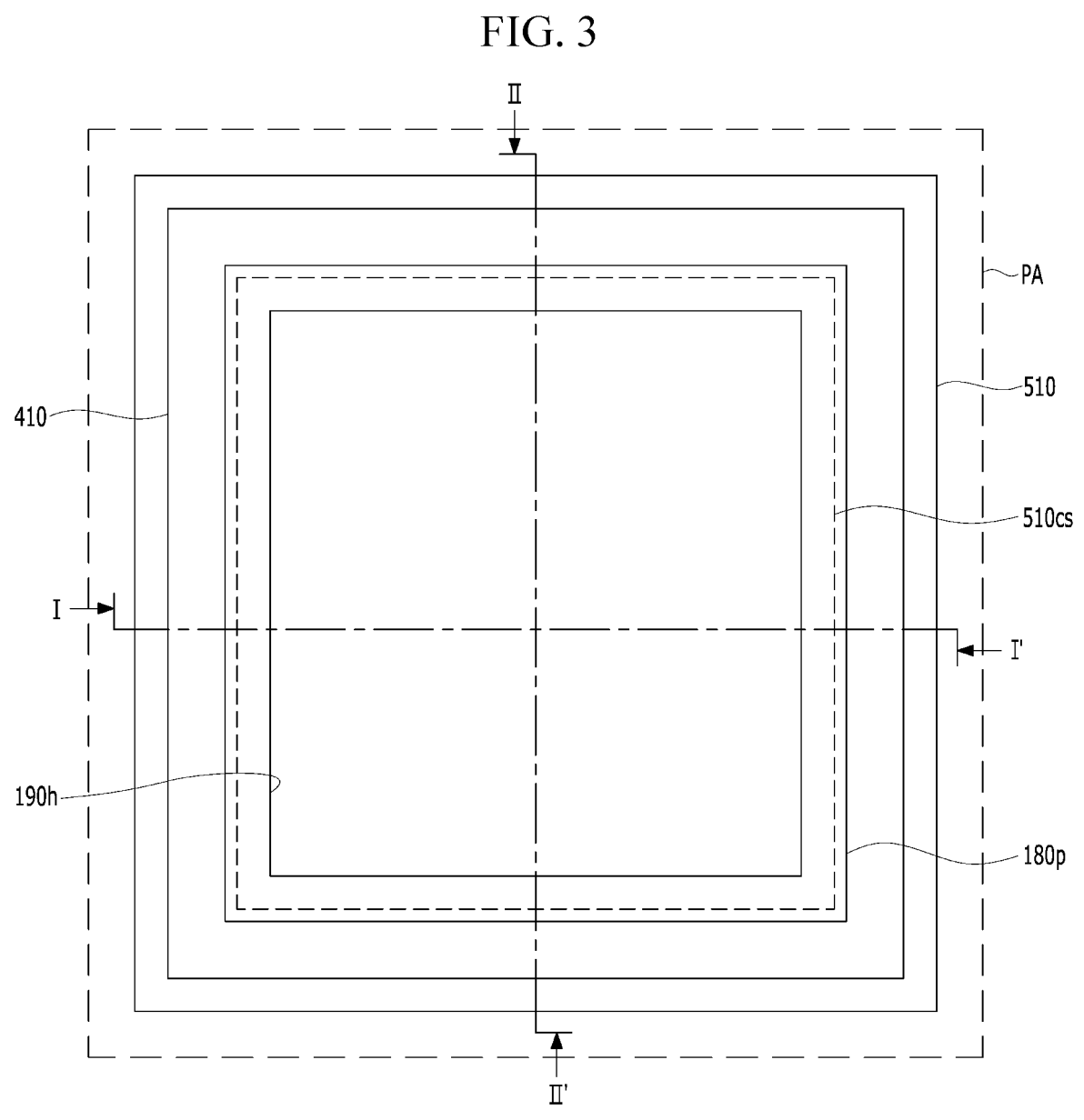
Figure 4:
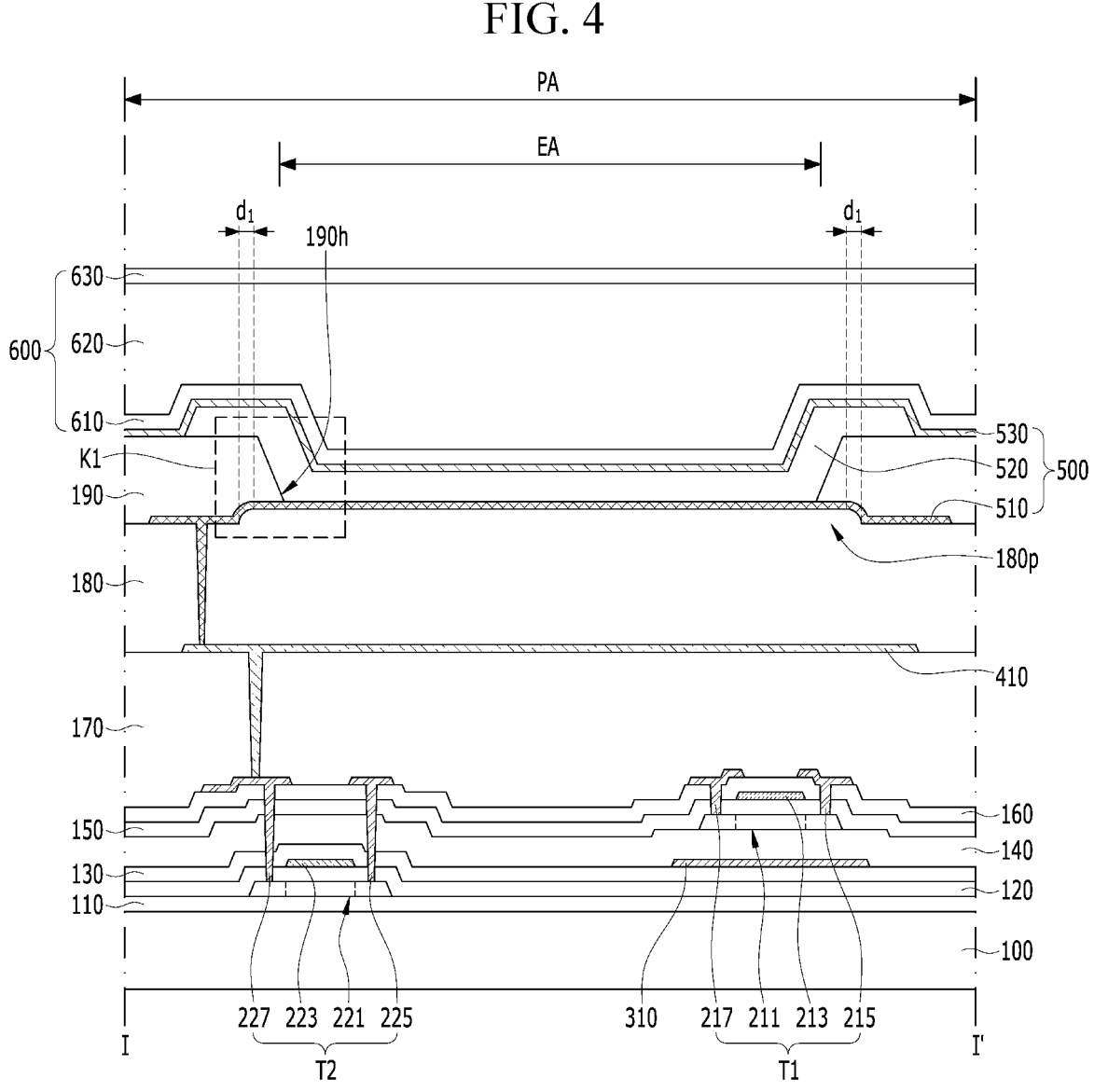
FIG. 4 is a view taken along I-I' of FIG. 3.
Figure 5:
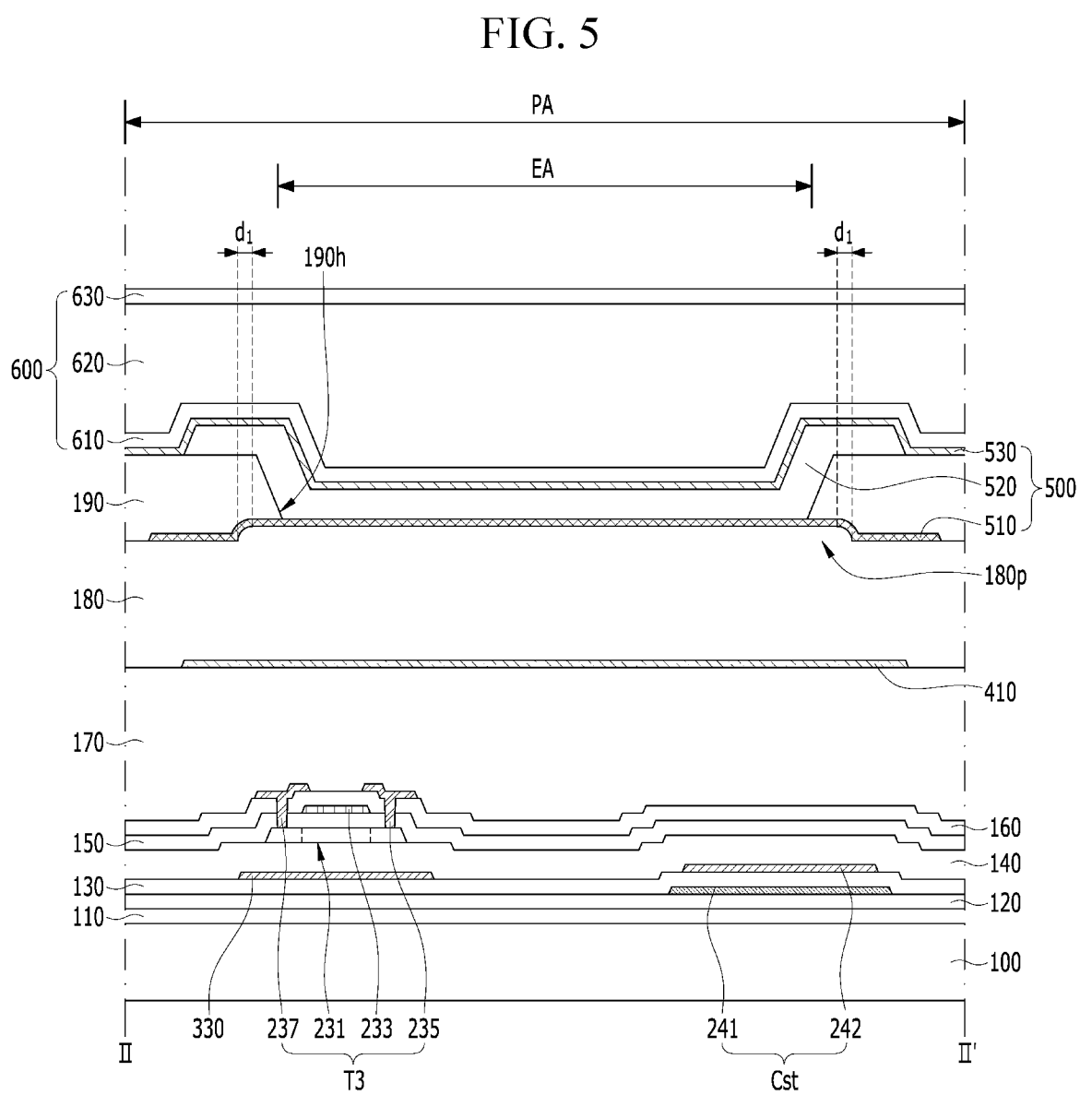
Figure 6:
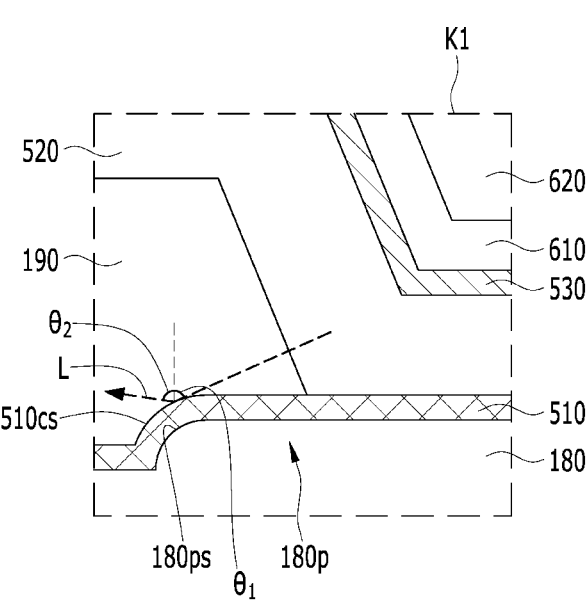
FIG. 6 is an enlarged view of K1 in FIG. 4.

FIG. 3 is a top view of the unit pixel area in the display device according to the aspect of the present disclosure. FIG. 4 is a view taken along I-I' of FIG. 3. FIG. 5 is a view taken along II-II' of FIG. 3. FIG. 6 is an enlarged view of K1 region in FIG. 4.

Referring to FIGS. 2 to 6, the first thin film transistor T1 may include a first semiconductor pattern 211, a first gate electrode 213, a first drain electrode 215 and a first source electrode 217. The first thin film transistor T1 may transmit the data signal to the second thin film transistor T2 according to the gate signal. For example, the first thin film transistor T1 may be a switching thin film transistor. The first gate electrode 213 may be electrically connected to one of the gate lines GL, and the first drain electrode 215 may be electrically connected to one of the date lines DL.

The first semiconductor pattern 211 may include a semiconductor material. For example, the first semiconductor pattern 211 may include an oxide semiconductor, such as IGZO. The first semiconductor pattern 211 may include a first drain region, a first channel region and a first source region. The first channel region may be disposed between the first drain region and the first source region. A resistance of the first drain region and a resistance of the first source region may be smaller than a resistance of the first channel region. For example, the first drain region and the first source region may include a conductorized region of an oxide semiconductor. The first channel region may be a region of an oxide semiconductor, which is not conductorized.

The first gate electrode 213 may include a conductive material. For example, the first gate electrode 213 may include a metal, such as aluminum (Al), chrome (Cr), copper (Cu), molybdenum (Mo), titanium (Ti) and tungsten (W). The first gate electrode 213 may be disposed on the first semiconductor pattern 211. For example, the first gate electrode 213 may overlap the first channel region of the first semiconductor pattern 211. The first source region and the first drain region of the first semiconductor pattern 211 may be disposed outside the first gate electrode 213. The first gate electrode 213 may be insulated from the first semiconductor pattern 211. For example, the first source region of the first semiconductor pattern 211 may be electrically connected to the first drain region of the first semiconductor pattern 211 according to the gate signal.

The first drain electrode 215 may include a conductive material. For example, the first drain electrode 215 may include a metal, such as aluminum (Al), chrome (Cr), copper (Cu), molybdenum (Mo), titanium (Ti) and tungsten (W). The first drain electrode 215 may include a material different from the first gate electrode 213. The first drain electrode 215 may be disposed on a layer different from the first gate electrode 213. For example, the first drain electrode 215 may be insulated from the first gate electrode 213. The first drain electrode 215 may be electrically connected to the first drain region of the first semiconductor pattern 211.

The first source electrode 217 may include a conductive material. For example, the first source electrode 217 may include a metal, such as aluminum (Al), chrome (Cr), copper (Cu), molybdenum (Mo), titanium (Ti) and tungsten (W). The first source electrode 217 may include a material different from the first gate electrode 213. The first source electrode 217 may be disposed on a layer different from the first gate electrode 213. For example, the first source electrode 217 may be disposed on a same layer as the first drain electrode 215. The first source electrode 217 may include a same material as the first drain electrode 215. The first source electrode 217 may be insulated from the first gate electrode 213. For example, the first source electrode 217 may be electrically connected to the first source region of the first semiconductor pattern 211.

The second thin film transistor T2 may include a second semiconductor pattern 221, a second gate electrode 223, a second drain electrode 225 and a second source electrode 227. The second thin film transistor T2 may generate the driving current corresponding to the data signal. For example, the second thin film transistor T2 may be a driving thin film transistor. The second gate electrode 223 may be electrically connected to the first source electrode 217, and the second drain electrode 225 may be electrically connected to the power voltage supply lines PL.

The second semiconductor pattern 221 may include a semiconductor material. The second semiconductor pattern 221 may include a material different from the first semiconductor pattern 211. For example, the second semiconductor pattern 221 may include a low-temperature Poly-Si (LTPS). The second semiconductor pattern 221 may be disposed on a layer different from the first semiconductor pattern 211. Thus, in the display device according to the aspect of the present disclosure, the second semiconductor pattern 221 may have electrical characteristics different from the first semiconductor pattern 211. That is, in the display device according to the aspect of the present disclosure, the characteristics of the second thin film transistor T2 may be different from the characteristics of the first thin film transistor T1. Therefore, in the display device according to the aspect of the present disclosure, damage of the first semiconductor pattern 211 due to a process of forming the second semiconductor pattern 221 may be prevented.

The second semiconductor pattern 221 may include a second channel region between a second drain region and a second source region. The second drain region and a second source region may have a resistance smaller than the second channel region. For example, the second drain region and the second source region may include a conductive impurity. The second channel region may be a region in which the conductive impurity is not doped.

The second gate electrode 223 may include a conductive material. For example, the second gate electrode 213 may include a metal, such as aluminum (Al), chrome (Cr), copper (Cu), molybdenum (Mo), titanium (Ti) and tungsten (W). The second gate electrode 223 may include a material different from the first gate electrode 213. For example, the second gate electrode 223 may be disposed on a layer different from the first gate electrode 213. The second gate electrode 223 may be disposed on the second semiconductor pattern 221. For example, the second gate electrode 223 may overlap the second channel region of the second semiconductor pattern 221. The second source region and the second drain region of the second semiconductor pattern 221 may be disposed outside the second gate electrode 223. The second gate electrode 223 may be insulated from the second semiconductor pattern 221. For example, the second channel region of the second semiconductor pattern 221 may have an electrical conductivity corresponding to a voltage applied to the second gate electrode 223.

The second drain electrode 225 may include a conductive material. For example, the second drain electrode 225 may include a metal, such as aluminum (Al), chrome (Cr), copper (Cu), molybdenum (Mo), titanium (Ti) and tungsten (W). The second drain electrode 225 may include a material different from the second gate electrode 223. The second drain electrode 225 may be disposed on a layer different from the second gate electrode 223. For example, the second drain electrode 225 may be insulated from the second gate electrode 223. The second drain electrode 225 may be electrically connected to the second drain region of the second semiconductor pattern 221.

The second drain electrode 225 may be disposed on a same layer as the first drain electrode 215. The second drain electrode 225 may include a same material as the first drain electrode 215. For example, the second drain electrode 225 may be formed simultaneously with the first drain electrode 215.

The second source electrode 227 may include a conductive material. For example, the second source electrode 227 may include a metal, such as aluminum (Al), chrome (Cr), copper (Cu), molybdenum (Mo), titanium (Ti) and tungsten (W). The second source electrode 227 may include a material different from the second gate electrode 223. For example, the second source electrode 227 may include a same material as the second drain electrode 225. The second source electrode 227 may be disposed on a same layer as the second drain electrode 225. The second source electrode 227 may be disposed on a layer different from the second gate electrode 223. For example, the second source electrode 227 may be insulated from the second gate electrode 223. The second source electrode 227 may be electrically connected to the second source region of the second semiconductor pattern 221.

The second source electrode 227 may be disposed on a same layer as the first source electrode 217. The second source electrode 227 may include a same material as the first source electrode 217. For example, the second source electrode 227 may be formed simultaneously with the first source electrode 217.

The third thin film transistor T3 may include a third semiconductor pattern 231, a third gate electrode 233, a third drain electrode 235 and a third source electrode 237. The third thin film transistor T3 may reset the storage capacitor Cst according to the gate signal. For example, the third thin film transistor T3 may be electrically connected between the storage capacitor Cst and the reference voltage supply line RL. The third gate electrode 233 may be electrically connected to the gate line GL same as the first gate electrode 213, the third drain electrode 235 may be electrically connected to the reference voltage supply line RL, and the third source electrode 237 may be electrically connected to the storage capacitor Cst. For example, the third thin film transistor T3 may be a switching thin film transistor.

The third thin film transistor T3 may be formed simultaneously with the first thin film transistor T1. For example, the third semiconductor pattern 231 may be formed simultaneously with the first semiconductor pattern 211, the third gate electrode 233 may be formed simultaneously with the first gate electrode 213. The third semiconductor pattern 231 may be disposed on a same layer as the first semiconductor pattern 211. The third semiconductor pattern 231 may include a same material as the first semiconductor pattern 211. For example, the third semiconductor pattern 231 may include an oxide semiconductor, such as IGZO. A third channel region of the third semiconductor pattern 231 may include a same resistance as the first channel region of the first semiconductor pattern 211. The third gate electrode 233 may be disposed on a same layer as the first gate electrode 213. The third gate electrode 233 may include a same material as the first gate electrode 213.

The third drain electrode 235 and the third source electrode 237 may be formed simultaneously with the first drain electrode 215 and the first source electrode 217. For example, the third drain electrode 235 and the third source electrode 237 may be disposed on a same layer as the first drain electrode 215 and the first source electrode 217. The third drain electrode 235 an the third source electrode 237 may be disposed on a layer different from the third gate electrode 233. The third drain electrode 235 and the third source electrode 237 may include a same material as the first drain electrode 215 and the first source electrode 217. Thus, in the display device according to the aspect of the present disclosure, process efficiency may be improved.

The storage capacitor Cst may maintain a signal applied to the second gate electrode 223 of the second thin film transistor T2 for one frame. For example, the storage capacitor Cst may be electrically connected between the second gate electrode 223 and the second source electrode 227 of the second thin film transistor T2. The storage capacitor Cst may have a stacked structure of capacitor electrodes 241 and 242. For example, the storage capacitor Cst may have a stacked structure of a first capacitor electrode 241 and a second capacitor electrode 242. The second capacitor electrode 242 may be disposed on the first capacitor electrode 241. For example, the first capacitor electrode 241 may be disposed between the device substrate 100 and the second capacitor electrode 242.

One of the capacitor electrodes 241 and 242 of the storage capacitor Cst may be electrically connected to the second gate electrode 223 of the second thin film transistor T2. For example, the second gate electrode 223 may be electrically connected to the first capacitor electrode 241. The first capacitor electrode 241 may be disposed on a same layer as the second gate electrode 223. The first capacitor electrode 241 may include a same material as the second gate electrode 223. For example, the first capacitor electrode 241 may be formed simultaneously with the second gate electrode 223.

The second capacitor electrode 242 may be electrically connected to the second source electrode 227 of the second thin film transistor T2 and the third source electrode 237 of the third thin film transistor T3. The second capacitor electrode 242 may be disposed on a layer different from the second source electrode 227 and the third source electrode 237. For example, the second capacitor electrode 242 may include a material different from the second source electrode 227 and the third source electrode 237. Thus, in the display device according to the aspect of the present disclosure, the degree of freedom for the position and size of the second capacitor electrode 242 may be improved.

A plurality of insulating layers 110, 120, 130, 140, 150, 160, 170, 180 and 190 for preventing unnecessary electrical connection in each pixel area PA may be disposed on the device substrate 100. For example, a lower buffer layer 110, a lower gate insulating layer 120, a lower interlayer insulating layer 130, an upper buffer layer 140, an upper gate insulating layer 150, an upper interlayer insulating layer 160, a lower planarization layer 170, an upper planarization layer 180 and a bank insulating layer 190 may be disposed on the device substrate 100.

The lower buffer layer 110 may be disposed close to the device substrate 100. The lower buffer layer 110 may prevent pollution due to the device substrate 100 in a process of forming the pixel driving circuit DC of each pixel area PA. For example, an upper surface of the device substrate 100 toward the pixel driving circuit DC of each pixel area PA may be completely covered by the lower buffer layer 110. The pixel driving circuit DC of each pixel area PA may be disposed on the lower buffer layer 110. The lower buffer layer 110 may include an insulating material. For example, the lower buffer layer may include an inorganic insulating material, such as silicon oxide (SiOx) and silicon nitride (SiNx). The lower buffer layer 110 may include a multi-layer structure. For example, the lower buffer layer 110 may have a stacked structure of an inorganic insulating layer made of silicon oxide (SiOx) and an inorganic insulating layer made of silicon nitride (SiNx).

The lower gate insulating layer 120 may be disposed on the lower buffer layer 110. The lower gate insulating layer 120 may insulate between the second semiconductor pattern 221 and the second gate electrode 223 of each pixel area PA. For example, the second semiconductor pattern 223 of each pixel area PA may be disposed between the lower buffer layer 110 and the lower gate insulating layer 120. The lower gate insulating layer 120 may cover the second semiconductor pattern 221 of each pixel area PA. The second gate electrode 223 of each pixel area PA may be disposed on the lower gate insulating layer 120. The lower gate insulating layer 120 may include an insulating material. For example, the lower gate insulating layer 120 may include an inorganic insulating material, such as silicon oxide (SiOx) and silicon nitride (SiNx).

The lower interlayer insulating layer 130 may insulate second drain electrode 225 and the second source electrode 227 of each pixel area PA from the second gate electrode 223 of the corresponding pixel area PA. For example, the second gate electrode 223 of each pixel area PA may be disposed between the lower gate insulating layer 120 and the lower interlayer insulating layer 130. The first capacitor electrode 241 of the storage capacitor Cst in each pixel area PA may be disposed between the lower gate insulating layer 120 and the lower interlayer insulating layer 130. The lower interlayer insulating layer 130 may cover the second gate electrode 223 and the first capacitor electrode 241 of each pixel area PA. The second drain electrode 225 and the second source electrode 227 of each pixel area PA may be disposed on the lower interlayer insulating layer 130. The second capacitor electrode 242 of each pixel area PA may be disposed on the lower interlayer insulating layer 130. The lower interlayer insulating layer 130 may include an insulating material. For example, the lower interlayer insulating layer 130 may include silicon nitride (SiNx). Thus, in the display device according to the aspect of the present disclosure, the electrical characteristics of the second semiconductor pattern 221 may be stabilized by hydrogen contained in the lower interlayer insulating layer 130.

The upper buffer layer 140 may be disposed between the lower interlayer insulating layer 130 and the first semiconductor pattern 211 of each pixel area PA. The upper buffer layer 140 may extend between the lower interlayer insulating layer 130 and the third semiconductor pattern 231 of each pixel area PA. The upper buffer layer 140 may include an insulating material. The upper buffer layer 140 may include a material having a relatively low hydrogen content.

For example, the upper buffer layer 140 may be an inorganic insulating layer made of silicon oxide (SiOx). Thus, in the display device according to the aspect of the present disclosure, the movement of hydrogen contained in the lower interlayer insulating layer 130 in the direction of the first semiconductor pattern 211 and the third semiconductor pattern 231 of each pixel area PA may be blocked by the upper buffer layer 140. That is, in the display device according to the aspect of the present disclosure, changes in characteristics of the first semiconductor pattern 211 and the third semiconductor pattern 231 in each pixel area PA due to diffusion of hydrogen may be prevented. For example, the upper buffer layer 140 may have a thickness larger than the lower interlayer insulating layer 130. Therefore, in the display device according to the aspect of the present disclosure, a decrease in characteristics of the pixel driving circuit DC in each pixel area PA due to hydrogen may be prevented.

Light-blocking patterns 310 and 330 may be disposed between the lower interlayer insulating layer 130 and the upper buffer layer 140 of each pixel area PA. The light-blocking patterns 310 and 330 may prevent changes in characteristics of the semiconductor patterns 211 and 231 including an oxide semiconductor due to external light. For example, the light-blocking patterns 310 and 330 may include a first light-blocking pattern 310 overlapping with the first semiconductor pattern 211 and a second light-blocking pattern 330 overlapping with the third semiconductor pattern 231. The first light-blocking pattern 310 and the second light-blocking pattern 330 may include a conductive material. For example, the first light-blocking pattern 310 and the second light-blocking pattern 330 may include a metal, such as aluminum (Al), chrome (Cr), copper (Cu), molybdenum (Mo), titanium (Ti) and tungsten (W). Thus, in the display device according to the aspect of the present disclosure, the external light traveling in the direction of the first semiconductor pattern 211 of each pixel area PA through the device substrate 100 may be blocked by the first light-blocking pattern 310 of the corresponding pixel area PA, and the external light traveling in the direction of the third semiconductor pattern 231 of each pixel area PA through the device substrate 100 may be blocked by the second light-blocking pattern 330 of the corresponding pixel area PA. Therefore, in the display device according to the aspect of the present disclosure, changes in characteristics of the first thin film transistor T1 and the third thin film transistor T3 in each pixel area PA due to the external light may be prevented.

The second capacitor electrode 242 of each pixel area PA may be disposed on a same layer as the light-blocking patterns 310 and 330 of the corresponding pixel area PA. For example, the second capacitor electrode 242 of each pixel area PA may be disposed between the lower interlayer insulating layer 130 and the upper buffer layer 140. The second capacitor electrode 242 of each pixel area PA may include a same material as the first light-blocking pattern 310 and the second light-blocking pattern 330 of the corresponding pixel area PA. For example, the first light-blocking pattern 310 and the second light-blocking pattern 330 of each pixel area PA may be formed simultaneously with the second capacitor electrode 242 of the corresponding pixel area PA. Thus, in the display device according to the aspect of the present disclosure, the process efficiency may be improved.

The upper gate insulating layer 150 may insulate between the first semiconductor pattern 211 and the first gate electrode 213 of each pixel area PA. The third gate electrode 233 of each pixel area PA may be insulated from the third semiconductor pattern 231 of the corresponding pixel area PA by the upper gate insulating layer 150. For example, the first semiconductor pattern 211 and the third semiconductor pattern 231 of each pixel area PA may be disposed between the upper buffer layer 140 and the upper gate insulating layer 150. The upper gate insulating layer 150 may cover the first semiconductor pattern 211 and the third semiconductor pattern 231 of each pixel area PA. The first gate electrode 213 and the third gate electrode 233 of each pixel area PA may be disposed on the upper gate insulating layer 150. The upper gate insulating layer 150 may include an insulating material. For example, the upper gate insulating layer 150 may be an inorganic insulating layer made of silicon oxide (SiOx).

The upper interlayer insulating layer 160 may insulate the first drain electrode 215 and the first source electrode 217 of each pixel area PA from the first gate electrode 213 of the corresponding pixel area PA. The third drain electrode 235 and the third source electrode 237 of each pixel area PA may be insulated from the third gate electrode 233 of the corresponding pixel area PA by the upper interlayer insulating layer 160. For example, the first drain electrode 215, the first source electrode 217, the third drain electrode 235 and the third source electrode 237 of each pixel area PA may be disposed on the upper interlayer insulating layer 160. The first drain electrode 215 and the first source electrode 217 of each pixel area PA may be connected to the first semiconductor pattern 211 of the corresponding pixel area PA by penetrating the upper gate insulating layer 150 and the upper interlayer insulating layer 160. The third drain electrode 235 and the third source electrode 237 of each pixel area PA may be connected to the third semiconductor pattern 231 of the corresponding pixel area PA by penetrating the upper gate insulating layer 150 and the upper interlayer insulating layer 160. The upper interlayer insulating layer 160 may include an insulating material. The upper interlayer insulating layer 160 may include a material different from the lower interlayer insulating layer 130. The upper interlayer insulating layer 160 may include a material having a relatively low hydrogen content. For example, the upper interlayer insulating layer 160 may be an inorganic insulating layer made of silicon oxide (SiOx). Thus, in the display device according to the aspect of the present disclosure, changes in characteristics of the first thin film transistor T1 and the third thin film transistor T3 in each pixel area PA due to hydrogen may be prevented.

The second drain electrode 225 and the second source electrode 227 of each pixel area PA may be disposed on the upper interlayer insulating layer 160. For example, the second drain electrode 225 and the second source electrode 227 of each pixel area PA may be connected to the second semiconductor pattern 221 of the corresponding pixel area PA by penetrating the lower gate insulating layer 120, the lower interlayer insulating layer 130, the upper buffer layer 140, the upper gate insulating layer 150 and the upper interlayer insulating layer 160.

The lower planarization layer 170 may be disposed on the upper interlayer insulating layer 160. For example, the drain electrodes 215, 225 and 235 and the source electrodes 217, 227 and 237 of each pixel area PA may be covered by the lower planarization layer 170. The upper planarization layer 180 may be disposed on the lower planarization layer 170. A thickness difference due to the pixel driving circuit DC of each pixel area PA may be relieved by the lower planarization layer 170 and the upper planarization layer 180. The lower planarization layer 170 and the upper planarization layer 180 may include an insulating material. The lower planarization layer 170 and the upper planarization layer 180 may include a material different from the upper interlayer insulating layer 160. For example, the lower planarization layer 170 and the upper planarization layer 180 may be an organic insulating layer including an organic insulating material. The upper planarization layer 180 may include a same material as the lower planarization layer 170. The upper planarization layer 180 may be in direct contact with an upper surface of the lower planarization layer 170 opposite to the device substrate 100. For example, a boundary surface between the lower planarization layer 170 and the upper planarization layer 180 may not be recognized.

The light-emitting device 500 of each pixel area PA may be disposed on the upper planarization layer 180. The light-emitting device 500 of each pixel area PA may emit light displaying a specific color. For example, the light-emitting device 500 of each pixel area PA may include a first electrode 510, a light-emitting layer 520 and a second electrode 530, which are sequentially stacked on the upper planarization layer 180 of the corresponding pixel area PA.

The first electrode 510 may include a conductive material. The first electrode 510 may include a material having a relatively high reflectance. For example, the first electrode 510 may be a metal, such as aluminum (Al) and silver (Ag). The first electrode 510 may have a multi-layer structure. For example, the first electrode 510 may have a structure in which a reflective electrode made of a metal is disposed between transparent electrodes made of a transparent conductive material, such as ITO and IZO.

The light-emitting layer 520 may generate light having luminance corresponding to a voltage difference between the first electrode 510 and the second electrode 530. For example, the light-emitting layer 520 may include an emission material layer (EML) having an emission material. The emission material may include an organic material, an inorganic material or a hybrid material. For example, the display device according to the aspect of the present disclosure may be an organic light-emitting display device including an organic emission material. The light-emitting layer 520 may have a multi-layer structure. For example, the light-emitting layer 520 may further include at least one of a hole injection layer (HIL), a hole transport layer (HTL), an electron transport layer (ETL) and an electron injection layer (EIL). Thus, in the display device according to the aspect of the present disclosure, the emission efficiency of the light-emitting layer 520 may be improved.

The second electrode 530 may include a conductive material. The second electrode 530 may include a material different from the first electrode 510. A transmittance of the second electrode 530 may be higher than a transmittance of the first electrode 510. For example, the second electrode 530 may be a transparent electrode made of a transparent conductive material, such as ITO and IZO, or a translucent electrode in which metals such as Ag and Mg are thinly formed. Thus, in the display device according to the aspect of the present disclosure, the light generated by the light-emitting layer 520 may be emitted outside through the second electrode 530.

The bank insulating layer 190 may be disposed on the upper planarization layer 180. The bank insulating layer 190 may define an emission area EA in each pixel area PA. For example, the bank insulating layer 190 may include openings 190h exposing a portion of the first electrode 510 in each pixel area PA. The bank insulating layer 190 may cover an edge of the first electrode 510 in each pixel area PA. The light-emitting layer 520 and the second electrode 530 of each pixel area PA may be sequentially stacked on the portion of the corresponding first electrode 510 exposed by one of the openings 190*h* of the bank insulating layer 190. The bank insulating layer 190 may include an insulating material. For example, the bank insulating layer 190 may be an organic insulating layer including an organic insulating material. The bank insulating layer 190 may include a material different from the upper planarization layer 180. The bank insulating layer 190 may include a transparent material.

The light emitted from the light-emitting device 500 of each pixel area PA may display a color different from the light emitted from the light-emitting device 500 of adjacent pixel area PA. For example, the light-emitting layer 520 of each pixel area PA may be spaced apart from the light-emitting layer 520 of adjacent pixel area PA. The light-emitting layer 520 of each pixel area PA may include an end on the bank insulating layer 190. The light-emitting layer 520 of each pixel area PA may be formed, individually. For example, the light-emitting layer 520 of each pixel area PA may be formed by using a fine metal mask (FMM). A spacer may be disposed on the bank insulating layer 190. The spacer may prevent damage of the bank insulating layer 190 and the light-emitting layer 520 in adjacent pixel area PA due to the fine metal mask. The spacer may include an insulating material. For example, the spacer may include an organic insulating material. The spacer may include a same material as the bank insulating layer 190. For example, the bank insulating layer 190 and the spacer may be formed simultaneously by a patterning process using a half-tone mask. The end of the light-emitting layer 520 in each pixel area PA may be spaced apart from the spacer.

A voltage applied to the second electrode 530 of each pixel area PA may be the same as a voltage applied to the second electrode 530 of adjacent pixel area PA. For example, the second electrode 530 of each pixel area PA may be electrically connected to the second electrode 530 of adjacent pixel area PA. The second electrode 530 of each pixel area PA may include a same material as the second electrode 530 of adjacent pixel area PA. For example, the second electrode 530 of each pixel area PA may be formed simultaneously with the second electrode 530 of adjacent pixel area PA. The second electrode 530 of each pixel area PA may be in direct contact with the second electrode 530 of adjacent pixel area PA. For example, the second electrode 530 of each pixel area PA may extend on the bank insulating layer 190. The bank insulating layer 190 may be covered by the second electrode 530. Thus, in the display device according to the aspect of the present disclosure, a process of forming the second electrode 530 in each pixel area PA may be simplified. In the display device according to the aspect of the present disclosure, the luminance of the light emitted from the light-emitting device 500 of each pixel area PA may be adjusted by the data signal applied to the pixel driving circuit DC of the corresponding pixel area PA.

The upper planarization layer 180 of each pixel area PA may include a protruding portion 180*p* overlapping with the emission area EA of the corresponding pixel area PA. For example, the protruding portion 180*p* of the upper planarization layer 180 in each pixel area PA may be covered by the first electrode 510 of the corresponding pixel area PA. The protruding portion 180*p* in each pixel area PA may include a same material as the upper planarization layer 180. For example, the protruding portion 180*p* of each pixel area PA may be formed by a process of recessing a portion of the upper planarization layer 180 using a half-tone mask or a slit mask.

An upper surface of the protruding portion 180*p* opposite to the device substrate 100 may be a flat surface. The emission area EA of each pixel area PA may have a size smaller than the upper surface of the protruding portion 180*p* in the corresponding pixel area PA. For example, the opening 190*h* of the bank insulating layer 190 in each pixel area PA may have a size smaller than the upper surface of the protruding portion 180*p* in the corresponding pixel area PA. The portion of the first electrode 510 exposed by one of the openings 190*h* of the bank insulating layer 190 in each pixel area PA may be disposed on the upper surface of the protruding portion 180*p* in the corresponding pixel area PA. the first electrode 510 of each pixel area PA may be in direct contact with the upper surface of the protruding portion 180*p* in the corresponding pixel area PA.

An edge 180*ps* of the protruding portion 180*p* in each pixel area PA may have a convex shape. For example, the edge 180*ps* of the protruding portion 180*p* in each pixel area PA may be a curved surface. The edge 180*ps* of the protruding portion 180*p* in each pixel area PA may have a constant curvature. For example, the edge 180*ps* of the protruding portion 180*p* having a convex shape in each pixel PA may have a closed loop shape extending along an outer edge of the emission area EA defined in the corresponding pixel area PA with a constant width d1.

The first electrode 510 of each pixel area PA may have a size larger than the protruding portion 180*p* in the corresponding pixel area PA. The first electrode 510 of each pixel area PA may include a curved region 510*cs* overlapping with the edge 180*ps* of the protruding portion 180*p* in the corresponding pixel area PA. For example, the curved region 510*cs* of the first electrode 510 in each pixel area PA may have a closed loop shape with a constant width extending along the outer edge of the opening 190*h* in the corresponding pixel area PA. Thus, in the display device according to the aspect of the present disclosure, an angle of the light L emitted in an outer direction of each pixel area PA may be increased by the curved area 510*cs* of the first electrode 510 in the corresponding pixel area PA. For example, in the display device according to the aspect of the present disclosure, the reflection angle $\theta 2$ of light reflected by the curved region 510*cs* of each first electrode 510 may be greater than the incident angle $\theta 1$ of light entering the curved region 510*cs* of the corresponding first electrode 510. That is, in the display device according to the aspect of the present disclosure, the emission angle of the light generated by each light-emitting device 500 may be increased by the curved region 510*cs* of the corresponding first electrode 510. Therefore, in the display device according to the aspect of the present disclosure, the luminance of the light L emitted in the outer direction of each pixel area PA may be increased.

Figure 7:
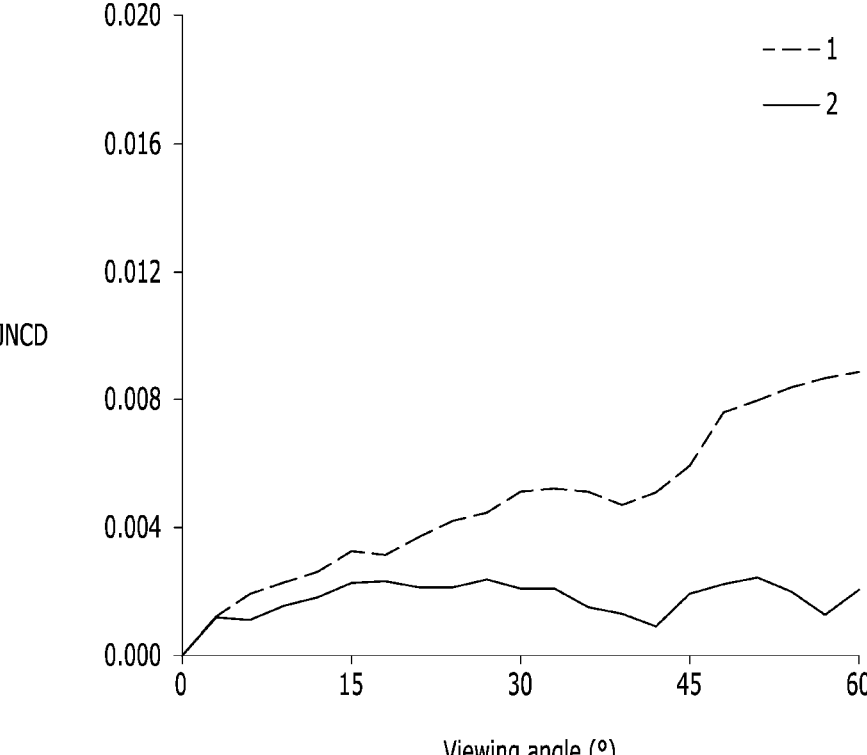
FIG. 7 is a graph showing a Just Noticeable Color Difference (JNCD) according to a viewing angle according to whether a curved area of a first electrode is included in a display device.

FIG. 7 is a graph showing a JNCD (Just Noticeable Color Difference) according to an viewing angle in the display device 1 in which the first electrode 510 of each light-emitting device 500 does not include a curved region 510*cs*, and the display device 2 in which the first electrode 510 of each light-emitting device 500 includes a curved region 510*cs*.

Referring to FIG. 7, it may be seen that the JNCD according to the viewing angle is 0.004 or less in the display device 2 in which the first electrode 510 of each light-emitting device 500 includes a curved region 510*cs*. Thus, in the display device according to the aspect of the present disclosure in which the first electrode 510 of each light-emitting device 500 includes a curved region 510*cs*, even if the viewing angle increases, the color accuracy may be maintained below a certain level. That is, in the display device according to the aspect of the present disclosure, changes in the color of the image according to the viewing angle may be minimized. Therefore, in the display device according to the aspect of the present disclosure, a quality deviation of the image according to the viewing angle may be minimized.

As shown in FIGS. 3 to 6, the curved region 510cs of the first electrode 510 in each pixel area PA may have a same curvature as the edge 180ps of the protruding portion 180p in the corresponding pixel area PA. For example, the first electrode 510 of each pixel area PA may be in direct contact with the edge 180ps of the protruding portion 180p in the corresponding pixel area PA. The emission area EA of each pixel area PA may be surrounded by the curved region 510cs of the first electrode 510 in the corresponding pixel area PA. Thus, in the display device according to the aspect of the present disclosure, the luminance deviation according to the azimuth angle may be prevented. That is, in the display device according to the aspect of the present disclosure, the luminance deviation according to the viewing angle may be the same in the upper/lower/left/right direction. Therefore, in the display device according to the aspect of the present disclosure, the luminance deviation of the image according to the azimuth angle may be minimized. And, in the display device according to the aspect of the present disclosure, the color variation of the image according to the azimuth angle may be minimized.

Intermediate electrodes 410 may be disposed between the lower planarization layer 170 and the upper planarization layer 180 of each pixel area PA. The intermediate electrodes 410 may include a conductive material. For example, the intermediate electrodes 410 may include a metal, such as aluminum (Al), chrome (Cr), copper (Cu), molybdenum (Mo), titanium (Ti) and tungsten (W). The first electrode 510 of each pixel area PA may be electrically connected to the second source electrode 227 of the corresponding pixel area PA by one of the intermediate electrodes 410. The intermediate electrode 410 of each pixel area PA may be electrically connected to the first electrode 510 and the second source electrode 227 of the corresponding pixel area PA. For example, each of the intermediate electrodes 410 may be in direct contact with the second source electrode 227 of each pixel area PA by penetrating the lower planarization layer 170 of the corresponding pixel area PA, and the first electrode 510 of each pixel area PA may be in direct contact with one of the intermediate electrodes 410 by penetrating the upper planarization layer 180 of the corresponding pixel area PA.

The intermediate electrode 410 of each pixel area PA may include a portion overlapping with the protruding portion 180p of the corresponding pixel area PA. For example, the intermediate electrode 410 of each pixel area PA may extend between the lower planarization layer 170 and the upper planarization layer 180 of the corresponding pixel area PA. The intermediate electrode 410 of each pixel area PA may have a symmetric shape with respect to a center of the emission area EA defined in the corresponding pixel area PA. The edge 180ps of the protruding portion 180p in each pixel area PA may be disposed on the intermediate electrode 410 of the corresponding pixel area PA. For example, the intermediate electrode 410 of each pixel area PA may have a size larger than the protruding portion 180p of the corresponding pixel area PA. Thus, in the display device according to the aspect of the present disclosure, the occurrence of a thickness difference in the upper surface of the protruding portion 180p of each pixel area PA due to the intermediate electrode 410 of the corresponding pixel area PA may be prevented. Therefore, in the display device according to the aspect of the present disclosure, the quality deviation of the image according to the viewing angle and the azimuth angle may be effectively minimized.

An encapsulation unit 600 may be disposed on the light-emitting device 500 of each pixel area PA. The encapsulation unit 600 may prevent damage of the light-emitting devices 500 due to external moisture and impact. The encapsulation unit 600 may have a multi-layer structure. For example, the encapsulation unit 600 may include a first encapsulating layer 610, a second encapsulating layer 620 and a third encapsulating layer 630, which are sequentially stacked. The first encapsulating layer 610, the second encapsulating layer 620 and the third encapsulating layer 630 may include an insulating material. The second encapsulating layer 620 may include a material different from the first encapsulating layer 610 and the third encapsulating layer 630. For example, the first encapsulating layer 610 and the third encapsulating layer 630 may be an inorganic insulating layer made of silicon nitride (SiNx) or silicon oxide (SiOx), and the second encapsulating layer 620 may be an organic insulating layer made of an organic insulating material. Thus, in the display device according to the aspect of the present disclosure, the damage of the light-emitting devices 500 due to the external moisture and impact may be effectively prevented.

Accordingly, the display device according to the aspect of the present disclosure may include the light-emitting device 500 on the upper planarization layer 180 of each pixel area PA, wherein the upper planarization layer 180 may include the protruding portion 180p overlapping with the emission area EA defined by the bank insulating layer 190 in each pixel area PA, the first electrode 510 of the light-emitting device 500 in each pixel area PA may cover the edge 180ps having a convex shape and the upper surface of the protruding portion 180p in the corresponding pixel area PA. Thus, in the display device according to the aspect of the present disclosure, the emission angle of the light generated by each light-emitting device 500 may be increased by the curved region 510cs of the corresponding first electrode 510. That is, in the display device according to the aspect of the present disclosure, the luminance deviation according to the viewing angle and the azimuth angle may be minimized. And, in the display device according to the aspect of the present disclosure, the color deviation according to the viewing angle and the azimuth angle may be minimized. Therefore, in the display device according to the aspect of the present disclosure, the characteristics in the viewing angle and the azimuth angle may be improved.

The first electrode 510 of each pixel area PA may be electrically connected to the corresponding intermediate electrode 410 at the outside of the protruding portion 180 in the corresponding pixel area PA. A contact hole for an electrical connection between the intermediate electrode 410 and the first electrode 510 of each pixel area PA may be spaced apart from the emission area EA defined in the corresponding pixel area PA by a predetermined distance. For example, the contact hole for the electrical connection between the intermediate electrode 410 and the first electrode 510 of each pixel area PA may be disposed outside the curved region 510cs of the corresponding first electrode 510. A distance between the contact hole for the electrical connection between the intermediate electrode 410 and the first electrode 510 of each pixel area PA and the edge 180ps of the protruding portion 180p in the corresponding pixel area PA may be greater than 4 μm. Thus, in the display device according to the aspect of the present disclosure, deformation of the curved region 510cs of the first electrode 510 in each pixel area PA due to the contact hole for the electrical connection between the intermediate electrode 410 and the first electrode 510 of the corresponding pixel area PA may be prevented. That is, in the display device according to the aspect of the present disclosure, curvature deviation of the curved region 510cs of the first electrode 510 in each pixel area PA due to the contact hole formed in the upper planarization layer 180 of the corresponding pixel area PA may be prevented. Therefore, in the display device according to the aspect of the present disclosure, degrease in the characteristics of the viewing angle and the azimuth angle due to the curvature deviation of the curved region 510cs of the first electrode 510 in each pixel area PA may be prevented.

Figure 8:
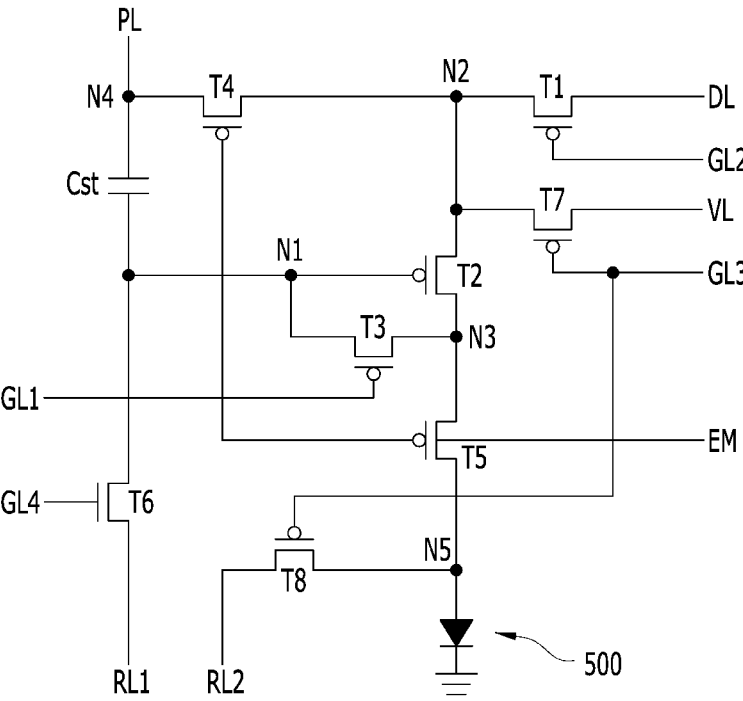
Figure 10:
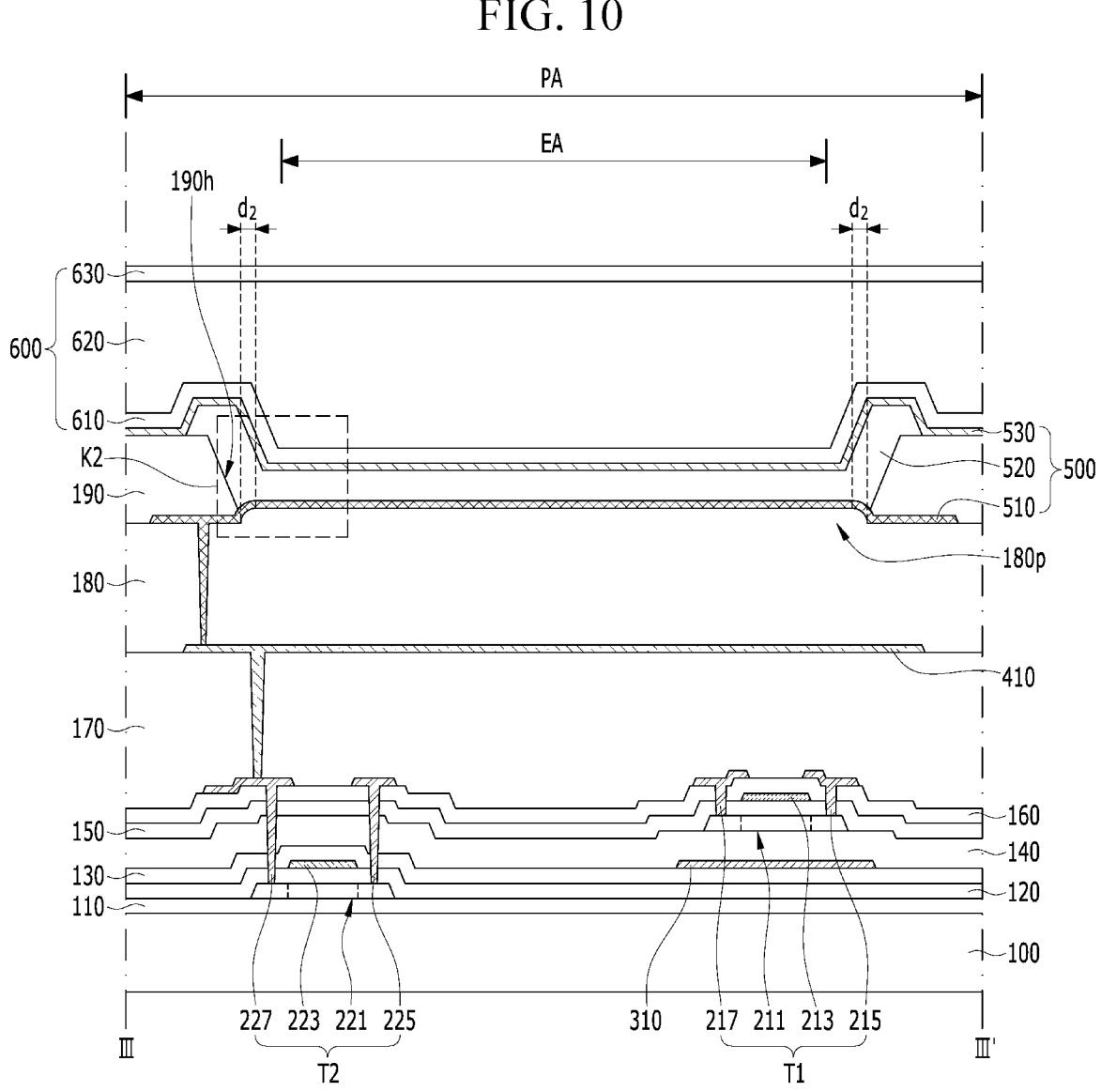

The display device according to the aspect of the present disclosure is described that the pixel driving circuit DC of each pixel area PA consists of the first thin film transistor T1, the second thin film transistor T2, the third thin film transistor T3, and the storage capacitor Cst. However, in the display device according to another aspect of the present disclosure, the pixel driving circuit DC of each pixel area PA may include at least one thin film transistor. For example, in the display device according to another aspect of the present disclosure, the pixel driving circuit DC of each pixel area PA may include the first thin film transistor T1, the second thin film transistor T2, and the storage capacitor Cst. And, in the display device according to another aspect of the present disclosure, the pixel driving circuit DC of each pixel area PA may include four or more thin film transistors. For example, in a display device according to another aspect of the present disclosure, the pixel driving circuit DC of each pixel area PA may include eight thin film transistors T1, T2, T3, T4, T5, T6, T7 and T8 and one storage capacitor Cst, as shown in FIG. 8. A first thin film transistor T1 of each pixel driving circuit DC may be turned on by a signal applied through a second gate line GL2 to supply the data signal to a second node N2. A third thin film transistor T3 of each pixel driving circuit DC may be turned on by a signal applied through a first gate line GL1 to diode connect a first node N1 and a third node N3. A fourth thin film transistor T4 of each pixel driving circuit DC may be turned on by a signal supplied through an emission control line EM to supply a power voltage applied through the power voltage supply line PL to the second node N2. A fifth thin film transistor T5 of each pixel driving circuit DC may be turned on by the signal applied through the emission control line EM to electrically connect the third node N3 to a fifth node N5. A sixth thin film transistor T6 of each pixel driving circuit DC may be turned on by a signal applied through a fourth gate line GL4 to supply a first reset voltage applied through a first reset line RL1 to a first node N1. A seventh thin film transistor T7 of each pixel driving circuit DC may be turned on by a signal applied through a third gate line GL3 to supply a bias voltage applied through a bias line VL to the second node N2. A eighth thin film transistor T8 of each pixel driving circuit DC may be turned on by a signal applied through the third gate line GL3 to supply a second reset voltage applied through a second reset line RL2 to the fifth node N5. A storage capacitor Cst of each pixel driving circuit DC may be electrically connected between the first node N1 and the fourth node N4. A second thin film transistor T2 of each pixel driving circuit DC may be turned on by a signal applied to the first node N1 to generate a driving current corresponding to the data signal applied to the second node N2. For example, the second thin film transistor T2 of each pixel driving circuit DC may be a driving thin film transistor. Thus, in the display device according to another aspect of the present disclosure, the degree of freedom for configuring the pixel driving circuit DC in each pixel area PA may be improved.

In the display device according to the aspect of the present disclosure, the position and the electrical connection of the drain electrodes 215, 225 and 235 and the source electrode 217, 227 and 237 in each pixel area PA may vary depending on the configuration of the pixel driving circuit DC in the corresponding pixel area PA and/or the type of the corresponding thin film transistors T1, T2, and T3. For example, in the display device according to another aspect of the present disclosure, the second gate electrode 223 of the second thin film transistor T2 in each pixel area PA may be electrically connected to the first drain electrode 215 of the first thin film transistor T1 in the corresponding pixel area PA. Thus, in the display device according to another aspect of the present disclosure, the degree of freedom for the configuration of the pixel driving circuit DC in each pixel area PA and the type of the thin film transistors T1, T2, and T3 included in each pixel driving circuit DC may be improved.

The display device according to the aspect of the present disclosure is described that the light-emitting layer 520 of each pixel area PA is spaced apart from the light-emitting layer 520 of adjacent pixel area PA. However, in the display device according to another aspect of the present disclosure, the color of each pixel area PA may be realized by a color filter. For example, the display device according to another aspect of the present disclosure may include the color filters on the encapsulation unit 600 covering the light-emitting devices 500. Each of the color filters may overlap the emission area EA of one of the pixel areas PA. Each of the light-emitting devices 500 may overlap one of the color filters.

The light generated by the light-emitting layer 520 of each pixel area PA may display a same color as the light generated by the light-emitting layer 520 of adjacent pixel area PA. For example, the light-emitting layer 520 of each pixel area PA may generate white light. The light-emitting layer 520 of each pixel area PA may include a same material as the light-emitting layer 520 of adjacent pixel area PA. The light-emitting layer 520 of each pixel area PA may include a same structure as the light-emitting layer 520 of adjacent pixel area PA. For example, the light-emitting layer 520 of each pixel area PA may be formed simultaneously with the light-emitting layer 520 of adjacent pixel area PA. The light-emitting layer 520 of each pixel area PA may be in direct contact with the light-emitting layer 520 of adjacent pixel area PA. Thus, in the display device according to another aspect of the present disclosure, a process of forming the light-emitting layer 520 in each pixel area PA may be simplified.

The display device according to the aspect of the present disclosure is described that the curved region 510cs of the first electrode 510 in each pixel area PA is covered by the bank insulating layer 190. However, in the display device according to another aspect of the present disclosure, the opening 190h of the bank insulating layer 190 in each pixel area PA may overlap at least a portion of the edge 180ps of the protruding portion 180p in the corresponding pixel area PA. For example, in the display device according to another aspect of the present disclosure, the curved region 510cs of the first electrode 510 in each pixel area PA may be partially exposed by the bank insulating layer 190, as shown in FIGS. 9 to 12. The curved region 510cs of each first electrode 510 partially exposed by the bank insulating layer 190 may have a constant width D2. For example, the curved region 510cs of each first electrode 510 partially exposed by the bank insulating layer 190 may have a closed loop shape extending along the outer edge of the opening 190h in the corresponding pixel area PA with a constant width D2. Thus, in the display device according to another aspect of the present disclosure, some of the light reflected in the inclined direction by the curved region 510cs of the first electrode 510 in each pixel area PA may not pass through the bank insulating layer 190. For example, in the display device according to another aspect of the present disclosure, the light L1 generated on the curved region 510cs of the first electrode 510 in each pixel area PA and some of the light L2 reflected by the curved region 510cs of the first electrode 510 in the corresponding pixel area PA may be emitted outside without passing through the bank insulating layer 190. Therefore, in the display device according to another aspect of the present disclosure, a decrease in the luminance of the viewing angle and the azimuth angle due to the bank insulating layer 190 may be reduced. That is, in the display device according to another aspect of the present disclosure, a decrease in the color of the viewing angle and the azimuth angle due to the bank insulating layer 190 may be reduced. And, in the display device according to another aspect of the present disclosure, a decrease in the quality of the image according to the viewing angle and the azimuth angle may be effectively prevented.

Figure 13:
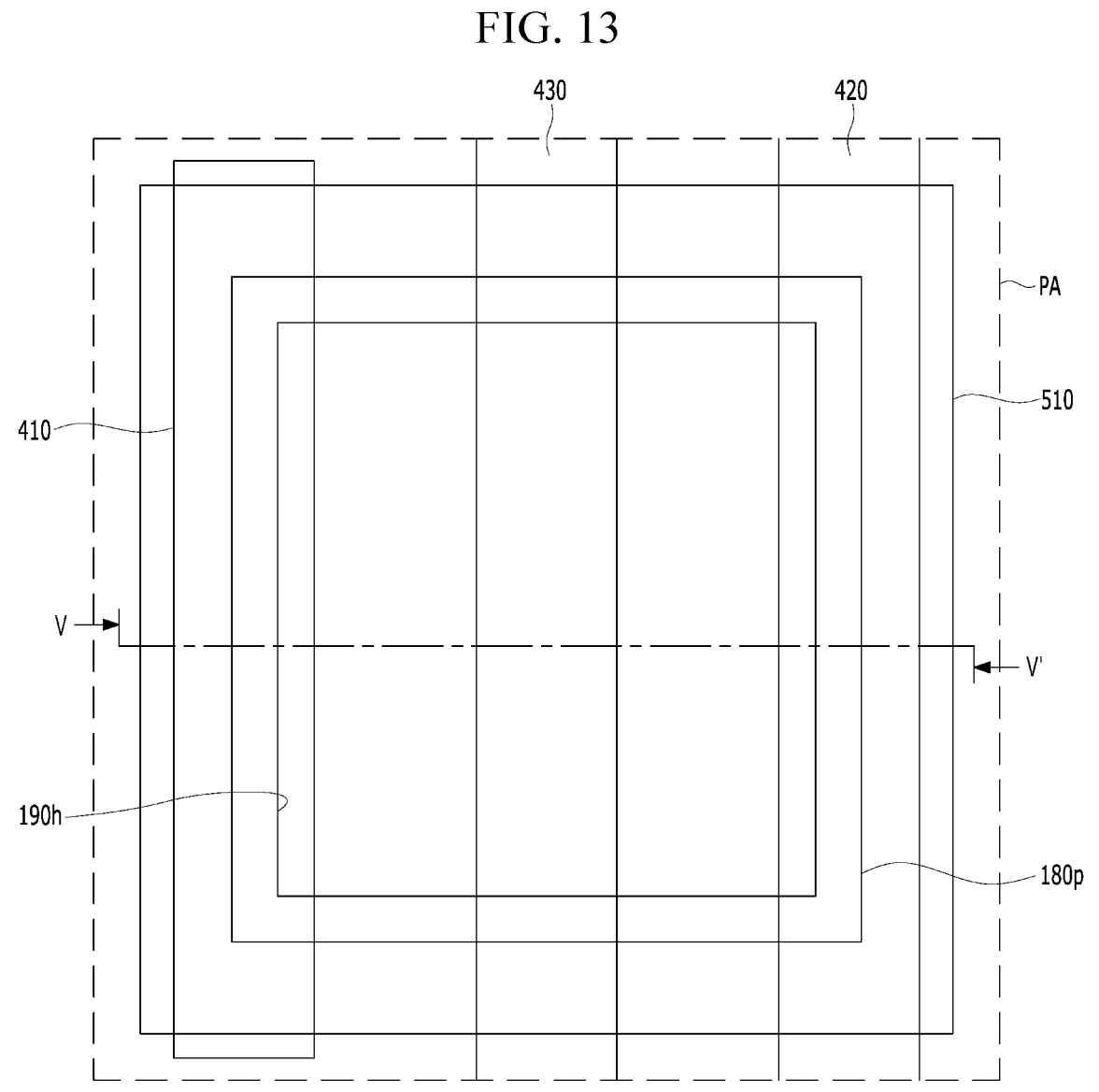
Figure 14:
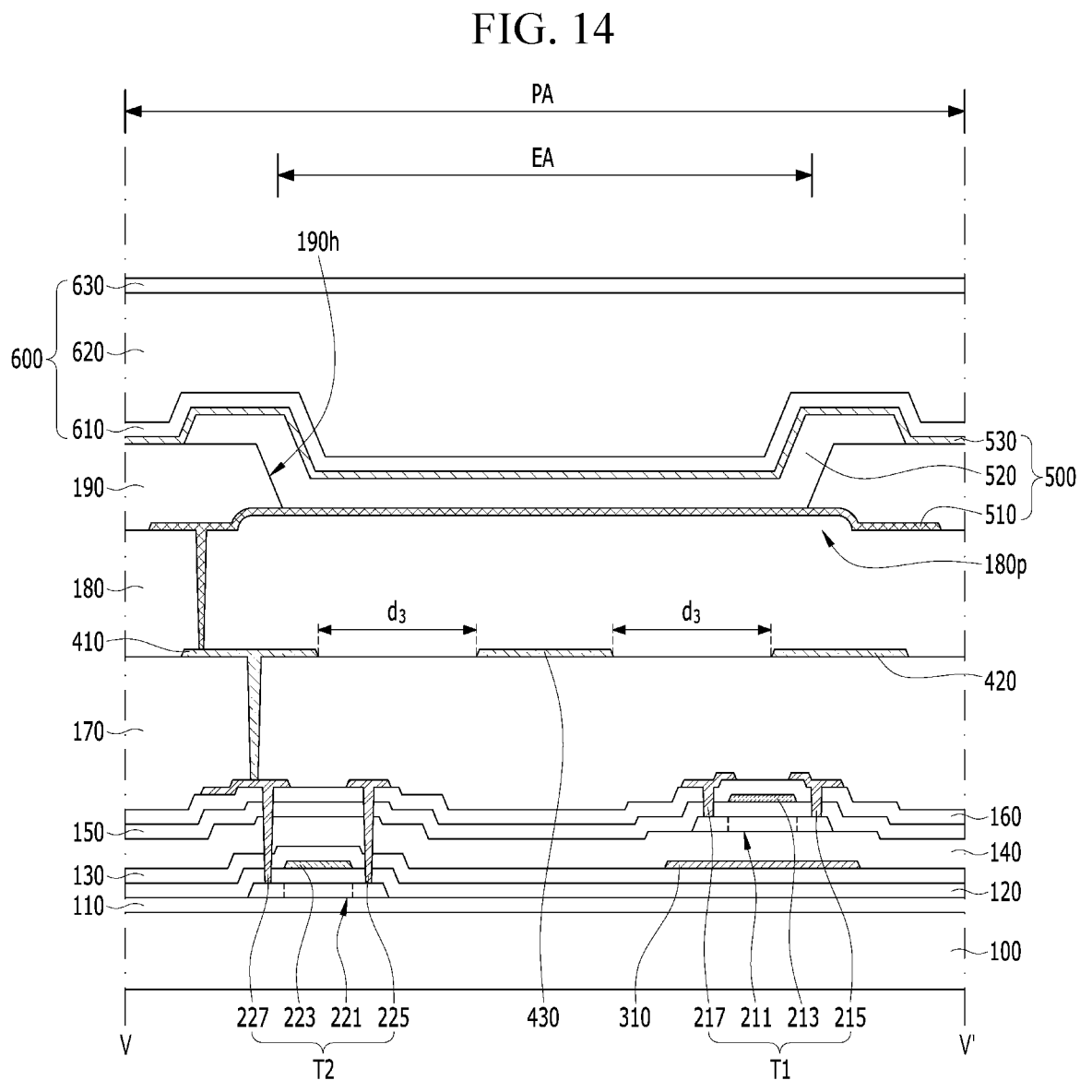

The display device according to the aspect of the present disclosure is described that the intermediate electrode 410 of each pixel area PA is a plate shape including a portion overlapping with the emission area EA of the corresponding pixel area PA. However, in the display device according to another aspect of the present disclosure, the intermediate electrode 410 of each pixel area PA may have various shapes. For example, the display device according to another aspect of the present disclosure may include signal wirings 420 and 430 between the lower planarization layer 170 and the upper planarization layer 180 of each pixel area PA, as shown in FIGS. 13 and 14. The signal wirings 420 and 430 may be disposed on a same layer as the intermediate electrode 410 of each pixel area PA. The signal wirings 420 and 430 may include a same material as the intermediate electrode 410 of each pixel area PA. For example, the signal wirings 420 and 430 may be formed simultaneously with the intermediate electrode 410 of each pixel area PA. Each of the signal wirings 420 and 430 may have a same thickness as the intermediate electrode 410 of each pixel area PA.

The signal wirings 420 and 430 may be one of the gate line GL, the date line DL, the power voltage supply line PL and the reference voltage supply line RL. For example, each of the signal wirings 420 and 430 may cross each pixel area PA in a direction. The intermediate electrode 410 of each pixel area PA may extend parallel to the signal wirings 420 and 430 in the corresponding pixel area PA. For example, the signal wirings 420 and 430 may cross each pixel area PA in a first direction, and the intermediate electrode 410 of each pixel area PA may extend in the first direction. The intermediate electrode 410 of each pixel area PA may be spaced apart from the signal wiring 420 and 430 in the corresponding pixel area PA. The intermediate electrode 410 and the signal wirings 420 and 430 of each pixel area PA may be disposed with respect to a center of the emission area EA defined in the corresponding pixel area PA. For example, the signal wirings 420 and 430 in each pixel area PA may include a first signal wiring 420 crossing the corresponding pixel area PA in the first direction and a second signal wiring 430 disposed side by side the first signal wiring 420, the second signal wiring 430 may cross the center of the emission area EA defined in the corresponding pixel area PA, and the intermediate electrode of each pixel area PA may be symmetrical to the first signal wiring 410 of the corresponding pixel area PA with respect to the second signal wiring 430 of the corresponding pixel area PA. A distance d3 between the intermediate electrode 410 and the second signal wiring 430 of each pixel area PA may be the same as a distance d3 between the first signal wiring 420 and the second signal wiring 430 of the corresponding pixel area PA. Each of the signal wirings 420 and 430 may have a same width as the intermediate electrode 410 of each pixel area PA. Thus, in the display device according to another aspect of the present disclosure, a thickness difference of the upper surface of the protruding portion 180p in each pixel area PA due to the intermediate electrode 410 and the signal wirings 420 and 430 of the corresponding pixel area PA may be prevented. Therefore, in the display device according to another aspect of the present disclosure, the degree of freedom for the shape of the intermediate electrode 410 in each pixel area PA may be improved. And, in the display device according to another aspect of the present disclosure, the degree of freedom for the arrangement of the signal wirings 420 and 430 may be improved.

The display device according to the aspect of the present disclosure is described that the second semiconductor pattern 221 of the second thin film transistor T2, which functions as a driving thin film transistor in each pixel driving circuit DC, includes low-temperature Poly-Si (LTPS). However, in the display device according to another aspect of the present disclosure, the pixel driving circuit DC of each pixel area PA may have various configurations. For example, in the display device according to another aspect of the present disclosure, the second semiconductor pattern 221 of the second thin film transistor T2 in each pixel area PA may include an oxide semiconductor, such as IGZO. The second semiconductor pattern 221 of each pixel area PA may include a same material as the first semiconductor pattern 211 of the corresponding pixel area PA. The second semiconductor pattern 221 of each pixel area PA may be disposed on a same layer as the first semiconductor pattern 211 of the corresponding pixel area PA. For example, the second semiconductor pattern 221 of each pixel area PA may be disposed between the upper buffer layer 140 and the upper gate insulating layer 150 of the corresponding pixel area PA. The second semiconductor pattern 221 of each pixel area PA may be formed simultaneously with the first semiconductor pattern 211 of the corresponding pixel area PA.

The second gate electrode 223 of each pixel area PA may be disposed on a same layer as the first gate electrode 213 of the corresponding pixel area PA. For example, the second gate electrode 223 of each pixel area PA may be disposed between the upper gate insulating layer 150 and the upper interlayer insulating layer 160 of the corresponding pixel area PA. The second gate electrode 223 of each pixel area PA may include a same material as the first gate electrode 213 of the corresponding pixel area PA. The second gate electrode 223 of each pixel area PA may be formed simultaneously with the first gate electrode 213 of the corresponding pixel area PA.

A driving light-blocking pattern 320 may be disposed between the lower buffer layer 110 and the second semiconductor pattern 221 of each pixel area PA. The driving light-blocking pattern 320 may include a material different from the first light-blocking pattern 310. A distance between the driving light-blocking pattern 320 and the second semiconductor pattern 221 may be smaller than a distance between the first light-blocking pattern 310 and the first semiconductor pattern 211. For example, the first light-blocking pattern 310 may be disposed between the lower gate insulating layer 120 and the lower interlayer insulating layer 130, and the driving light-blocking pattern 320 may be disposed between the lower interlayer insulating layer 130 and the upper buffer layer 140.

Generally, the amount of change in the effective gate voltage of the second thin film transistor T2 which is disposed on the driving light-blocking pattern 320 in each pixel area PA may be determined by the following equation. Herein, $\Delta V_{eff}$ denotes the amount of change in the effective gate voltage, $\Delta V_{GAT}$ denotes a change amount of a voltage applied to the second gate electrode 223, C1 denotes a capacitance of the parasitic capacitor formed between the driving light-blocking pattern 320 and the second semiconductor pattern 221, C2 denotes a capacitance of a parasitic capacitor formed between the second semiconductor pattern 221 and the second gate electrode 223, and $C_{ACT}$ denotes a capacitance of a parasitic capacitor formed by a voltage applied to the second source region and the second drain region of the second semiconductor pattern 221.

$$\Delta V_{eff} = \frac{C2}{C2 + C_{ACT} + C1} \times \Delta V_{GAT} \qquad \text{[equation 1]}$$

A capacitance of a capacitor is inversely proportional to a distance between the conductors constituting the capacitor. For example, when a thickness of the upper buffer layer 410 is reduced based on a thickness of the upper gate insulating layer 150, the effective gate voltage of the second thin film transistor T2 may be reduced. And, when the effective gate voltage of the second thin film transistor T2 is reduced, S-factor, which means the inverse ratio of the current change according to the change in voltage applied to the second gate electrode 223 of the second thin film transistor T2, increases. For example, when the effective gate voltage of the second thin film transistor T2 decreases, the rate of change in the driving current according to the voltage applied to the second gate electrode 223 of the second thin film transistor T2 may decrease. That is, in the display device according to the aspect of the present disclosure, the driving light-blocking pattern 320 may be disposed relatively close to the second semiconductor pattern 221, so the rate of change in the driving current according to the voltage applied to the second gate electrode 223 may be reduced. Thus, in the display device according to the aspect of the present disclosure, the occurrence of spot in the low grayscale may be prevented.

At least one circuit thin film transistor 290 may be disposed on the bezel area BZ of the device substrate 100. For example, in the display device according to another aspect of the present disclosure, the gate driver on the bezel area BZ may include the circuit thin film transistor 290. The circuit thin film transistor 290 may include a circuit semiconductor pattern 291, a circuit gate electrode 293, a circuit drain electrode 295 and a circuit source electrode 297.

The circuit semiconductor pattern 291 may include a semiconductor material. The circuit semiconductor pattern 291 may include a material different from the first semiconductor pattern 211 of each pixel area PA. For example, the circuit semiconductor pattern 291 may include a low-temperature Poly-Si (LTPS). The circuit semiconductor pattern 291 may be disposed on a layer different from the first semiconductor pattern 211 of each pixel area PA. For example, the circuit semiconductor pattern 291 may be disposed between the lower buffer layer 110 and the lower gate insulating layer 120. The circuit semiconductor pattern 291 may have electrical characteristics different from the first semiconductor pattern 211 of each pixel area PA.

The circuit gate electrode 293 may include a conductive material. For example, the circuit gate electrode 293 may include a metal, such as aluminum (Al), chrome (Cr), copper (Cu), molybdenum (Mo), titanium (Ti) and tungsten (W). The circuit gate electrode 293 may be disposed on the circuit semiconductor pattern 291. For example, the circuit gate electrode 293 may overlap a circuit channel region of the circuit semiconductor pattern 291. A circuit source region and a circuit drain region of the circuit semiconductor pattern 291 may be disposed outside the circuit gate electrode 293. The circuit gate electrode 293 may be insulated from the circuit semiconductor pattern 291. For example, the circuit source region of the circuit semiconductor pattern 291 may be electrically connected to the circuit drain region of the circuit semiconductor pattern 291 according to the corresponding signal.

The circuit gate electrode 293 may be disposed on a layer different from the first gate electrode 213 of each pixel area PA. For example, the circuit gate electrode 293 may be disposed between the lower gate insulating layer 120 and the lower interlayer insulating layer 130. The circuit gate electrode 293 may include a material different from the first gate electrode 213 of each pixel area PA.

The circuit drain electrode 295 and the circuit source electrode 297 may include a conductive material. For example, the circuit drain electrode 295 and the circuit source electrode 297 may include a metal, such as aluminum (Al), chrome (Cr), copper (Cu), molybdenum (Mo), titanium (Ti) and tungsten (W). The circuit drain electrode 295 and the circuit source electrode 297 may include a material different from the circuit gate electrode 293. The circuit drain electrode 295 and the circuit source electrode 297 may be disposed on a layer different from the circuit gate electrode 293. The circuit drain electrode 295 and the circuit source electrode 297 may be disposed on a same layer as the second drain electrode 225 and the second source electrode 227 of each pixel area PA. For example, the circuit drain electrode 295 and the circuit source electrode 297 may be disposed between the upper interlayer insulating layer 160 and the lower planarization layer 170. The circuit drain electrode 295 and the circuit source electrode 297 may be formed simultaneously with the first drain electrode 215 and the first source electrode 217 of each pixel area PA. Thus, in the display device according to another aspect of the present disclosure, the degree of freedom to the configuration of the pixel driving circuit DC in each pixel area PA may be improved.

In the result, the display device according to the aspects of the present disclosure may comprise the upper planarization layer on the pixel area of the device substrate, the bank insulating layer on the upper planarization layer, and the light-emitting device in the emission area defined by the bank insulating layer, wherein the upper planarization layer includes the protruding portion overlapping with the emission area, the edge of the protruding portion may be the curved surface having the constant curvature, the first electrode of the light-emitting device covering the protruding portion may include the curved region overlapping with the edge of the protruding portion. Thus, in the display device according to the aspects of the present disclosure, degrease of the luminance according to the viewing angle and the azimuth angle may be reduced.

In the display device according to the aspects of the present disclosure, degrease of the color according to the viewing angle and the azimuth angle may be reduced. Thereby, in the display device according to the aspects of the present disclosure, the quality deviation of the image according to the viewing angle and the azimuth angle may be minimized. That is, in the display device according to the aspects of the present disclosure, low power driving is possible and power consumption may be reduced.

It will be apparent to those skilled in the art that various modifications and variations can be made in the display device of the present disclosure without departing from the spirit or scope of the aspects. Thus, it is intended that the present disclosure covers the modifications and variations of the aspects provided they come within the scope of the appended claims and their equivalents.

What is claimed is:

1. A display device comprising:

an upper planarization layer disposed on a device substrate and including a protruding portion in a pixel area;

a first electrode disposed on the upper planarization layer and covering the protruding portion;

a bank insulating layer disposed on the upper planarization layer and including an opening exposing a portion of the first electrode;

a light-emitting layer disposed on the portion of the first electrode exposed by the opening of the bank insulating layer; and a second electrode disposed on the light-emitting layer and extending on the bank insulating layer, wherein an edge of the protruding portion has a curved surface with a constant curvature, and wherein the first electrode includes a curved region overlapping with the edge of the protruding portion.

2. The display device according to claim 1, wherein the curved region of the first electrode has a closed loop shape extending along an edge of the opening.

3. The display device according to claim 1, further comprising:

a lower planarization layer between the device substrate and the upper planarization layer; and an intermediate electrode between the lower planarization layer and the upper planarization layer of the pixel area, wherein the intermediate electrode has a symmetrical shape with respect to a center of the opening.

4. The display device according to claim 3, wherein the intermediate electrode has a size larger than the opening of the bank insulating layer.

5. The display device according to claim 1, wherein an upper surface of the protruding portion opposite to the device substrate is a flat surface.

6. The display device according to claim 5, wherein the opening of the bank insulating layer has a size larger than the upper surface of the protruding portion.

7. The display device according to claim 5, wherein the opening of the bank insulating layer overlaps at least a portion of the curved region of the first electrode, and wherein the curved region of the first electrode overlapping with the opening has a constant width.

8. The display device according to claim 7, wherein the curved region of the first electrode overlapping with the opening has a closed loop shape extending along the edge of the opening.

9. A display device comprising:

a bank insulating layer disposed on a pixel area of a device substrate, the bank insulating layer defining an emission area;

an upper planarization layer disposed between the device substrate and the bank insulating layer, the upper planarization layer including a protruding portion overlapping with the emission area; and a light-emitting device disposed on the upper planarization layer of the emission area, the light-emitting device having a stacked structure of a first electrode, a light-emitting layer and a second electrode, wherein the first electrode extends between the upper planarization layer and the bank insulating layer along a surface of the protruding portion opposite to the device substrate, and wherein an edge of the protruding portion has a convex shape.

10. The display device according to claim 9, wherein the edge of the protruding portion having a convex shape has a closed loop shape extending an outer edge of the emission area.

11. The display device according to claim 9, further comprising:

a lower planarization layer between the device substrate and the upper planarization layer;

a pixel driving circuit between the pixel area of the device substrate and the lower planarization layer;

an intermediate electrode between the lower planarization layer and the upper planarization layer, the intermediate electrode electrically connected to the pixel driving circuit and the first electrode; and a first signal wiring between the lower planarization layer and the upper planarization layer of the pixel area, the first signal wiring being spaced apart from the intermediate electrode, wherein the first signal wiring is symmetric with the intermediate electrode with respect to a center of the emission area.

12. The display device according to claim 11, wherein the first signal wiring extends in a direction, and wherein the intermediate electrode extends parallel to the first signal wiring in the pixel area.

13. The display device according to claim 11, wherein the first signal wiring includes a same material as the intermediate electrode.

14. The display device according to claim 11, wherein the first signal wiring has a same width as the intermediate electrode.

15. The display device according to claim 11, further comprising a second signal wiring between the lower planarization layer and the upper planarization layer, wherein the second signal wiring crosses a center of the emission area, and wherein a distance between the intermediate electrode and the second signal wiring is the same as a distance between the first signal wiring and the second signal wiring.

* * * * *